United States Patent
Joe et al.

(10) Patent No.: US 12,224,357 B2
(45) Date of Patent: Feb. 11, 2025

(54) SEMICONDUCTOR TRANSISTOR DEVICE INCLUDING MULTIPLE CHANNEL LAYERS WITH DIFFERENT MATERIALS

(71) Applicant: SAMSUNG ELECTRONICS CO., LTD., Suwon-si (KR)

(72) Inventors: Jinyeong Joe, Suwon-si (KR); Dongchan Suh, Seoul (KR); Sungkeun Lim, Seongnam-si (KR); Seokhoon Kim, Gyeonggi-do (KR); Pankwi Park, Incheon (KR); Dongsuk Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 476 days.

(21) Appl. No.: 17/804,102

(22) Filed: May 26, 2022

(65) Prior Publication Data
US 2023/0007959 A1   Jan. 12, 2023

(30) Foreign Application Priority Data
Jul. 12, 2021   (KR) .......................... 10-2021-0090927

(51) Int. Cl.
*H01L 29/786* (2006.01)
*H01L 29/06* (2006.01)
(Continued)

(52) U.S. Cl.
CPC .... *H01L 29/78696* (2013.01); *H01L 29/0673* (2013.01); *H01L 29/42392* (2013.01);
(Continued)

(58) Field of Classification Search
CPC ......... H01L 29/42392; H01L 29/78696; H01L 29/6656; H01L 29/66795; H01L 29/785; H01L 29/1079; H01L 29/165
See application file for complete search history.

(56) References Cited

U.S. PATENT DOCUMENTS 9,508,829 B1   11/2016   Cheng et al.
2014/0097502 A1   4/2014   Sun et al.
(Continued)

FOREIGN PATENT DOCUMENTS

KR   10-2014-0046258   4/2014
KR   10-2021-0000780   1/2021

*Primary Examiner* — Changhyun Yi
(74) *Attorney, Agent, or Firm* — F. CHAU & ASSOCIATES, LLC

(57) ABSTRACT

A semiconductor device includes a first active region, a second active region spaced apart from the first active region, a plurality of first channel layers disposed on the first active region, and a second channel layer disposed on the second active region. The semiconductor device further includes a first gate structure intersecting the first active region and the first channel layers, a second gate structure intersecting the second active region and the second channel layer, a first source/drain region disposed on the first active region and contacting the plurality of first channel layers, and a second source/drain region and contacting the second channel layer. The plurality of first channel layers includes a first uppermost channel layer and first lower channel layers disposed below the first uppermost channel layer, and the first uppermost channel layer includes a material that is different from a material included in the first lower channel layers.

20 Claims, 30 Drawing Sheets

(51) Int. Cl.
*H01L 29/423* (2006.01)
*H01L 29/66* (2006.01)
*H01L 29/78* (2006.01)

(52) U.S. Cl.
CPC .... *H01L 29/6656* (2013.01); *H01L 29/66795* (2013.01); *H01L 29/785* (2013.01)

(56) References Cited

U.S. PATENT DOCUMENTS

| | | |
|---|---|---|
| 2016/0027870 A1 | 1/2016 | Cheng et al. |
| 2016/0104765 A1 | 4/2016 | Ching et al. |
| 2016/0308055 A1 | 10/2016 | Obradovic et al. |
| 2017/0186846 A1 | 6/2017 | Badaroglu et al. |
| 2019/0058051 A1 | 2/2019 | Kim et al. |
| 2020/0075721 A1 | 3/2020 | Li et al. |
| 2020/0243399 A1 | 7/2020 | Bao et al. |
| 2020/0411698 A1 | 12/2020 | Kim et al. |
| 2021/0104523 A1 | 4/2021 | Fulford et al. |
| 2021/0134795 A1* | 5/2021 | Ju ................... H01L 21/823431 |
| 2021/0305389 A1* | 9/2021 | Liaw ............... H01L 21/823431 |

* cited by examiner

SEMICONDUCTOR TRANSISTOR DEVICE INCLUDING MULTIPLE CHANNEL LAYERS WITH DIFFERENT MATERIALS

CROSS-REFERENCE TO RELATED APPLICATIONS

This application claims priority under 35 U.S.C. § 119 to Korean Patent Application No. 10-2021-0090927, filed on Jul. 12, 2021, in the Korean Intellectual Property Office, the disclosure of which is incorporated by reference herein in its entirety.

TECHNICAL FIELD

The present inventive concept relates to a semiconductor device, specifically to a semiconductor device including multiple channel layers.

DISCUSSION OF RELATED ART

In line with an increase in demand for semiconductor devices having high performance, high speed, and/or multifunctionality, the degree of integration of semiconductor devices has increased, and this trend of high integration has led to semiconductor devices that include a fine pattern. During a manufacturing process for such semiconductor devices that include a fine pattern, it is beneficial to implement patterns that include a fine width and/or spacing distance.

SUMMARY

An embodiment of the inventive concept provides a semiconductor device having a reduced channel layer loss.

According to an embodiment of the inventive concept, a semiconductor device includes a substrate and active regions disposed on the substrate, the active regions including a first active region extending on the substrate in a horizontal direction parallel to an upper surface of the substrate and a second active region spaced apart from the first active region. The semiconductor device further includes a plurality of channel layers disposed on the active regions, the plurality of channel layers including a plurality of first channel layers disposed on the first active region and a second channel layer disposed on the second active region. The first channel layers of the plurality of first channel layers are spaced apart from each other in a vertical direction perpendicular to the upper surface of the substrate. The semiconductor device further includes gate structures disposed on the substrate, the gate structures including a first gate structure intersecting the first active region and the first channel layers and a second gate structure intersecting the second active region and the second channel layer. The semiconductor device further includes source/drain regions disposed on the active regions, the source/drain regions including a first source/drain region disposed on the first active region on at least one side of the first gate structure and contacting the plurality of first channel layers and a second source/drain region disposed on the second active region on at least one side of the second gate structure and contacting the second channel layer. The plurality of first channel layers includes a first uppermost channel layer and first lower channel layers disposed below the first uppermost channel layer, and the first uppermost channel layer includes a material that is different from a material included in the first lower channel layers.

According to an embodiment of the inventive concept, a semiconductor device includes a substrate and a first transistor disposed on the substrate, the first transistor including a first active region extending on the substrate in a first horizontal direction parallel to an upper surface of the substrate, a plurality of first channel layers disposed on the first active region, where first channel layers of the plurality of first channel layers are spaced apart from each other, the first channel layers including a first uppermost channel layer and first lower channel layers. The first transistor further includes a first gate structure intersecting the first active region and the plurality of first channel layers, and extending in a second horizontal direction, and a first source/drain region disposed on the first active region on at least one side of the first gate structure and contacting the plurality of first channel layers. The semiconductor device further includes a second transistor disposed on the substrate, the second transistor including a second active region disposed on the substrate and spaced apart from the first active region, a second channel layer disposed on the second active region, a second gate structure disposed on the substrate, intersecting the second active region and the second channel layer, and extending in a vertical direction perpendicular to the upper surface of the substrate, and a second source/drain region disposed on the second active region on at least one side of the second gate structure and contacting the second channel layer. A threshold voltage of the first transistor is lower than a threshold voltage of the second transistor. The first uppermost channel layer is thicker than each of the first lower channel layers. The second channel layer has a thickness greater than a sum of the thicknesses of the first channel layers of the plurality of first channel layers. The second channel layer includes a material that is different from a material included in the first uppermost channel layer.

According to an embodiment of the inventive concept, a semiconductor device includes a substrate, an active region disposed on the substrate and extending on the substrate in a first horizontal direction parallel to an upper surface of the substrate, and a plurality of channel layers disposed on the active regions, the plurality of channel layers including at least one lower channel layer disposed on the active region, the at least one lower channel layer including silicon, and an uppermost channel layer disposed on the at least one lower channel layer and spaced apart from the at least one lower channel layer in a vertical direction perpendicular to the upper surface of the substrate. The uppermost channel layer has a thickness greater than a thickness of the at least one lower channel layer, includes a material that is different from a material included in the at least one lower channel layer, and includes silicon carbide. The semiconductor device further includes a gate structure disposed on the substrate, intersecting the active region and the plurality of channel layers, and extending in a second horizontal direction. The gate structure includes a gate electrode surrounding the plurality of channel layers. The semiconductor device further includes spacer structures disposed on opposing sidewalls of the gate structure and a source/drain region disposed on the active region on at least one side of the gate structure and contacting the plurality of channel layers.

BRIEF DESCRIPTION OF DRAWINGS

The above and other features of the inventive concept will become more apparent by describing in detail embodiments thereof with reference to the accompanying drawings, in which.

DETAILED DESCRIPTION

Figure 1:
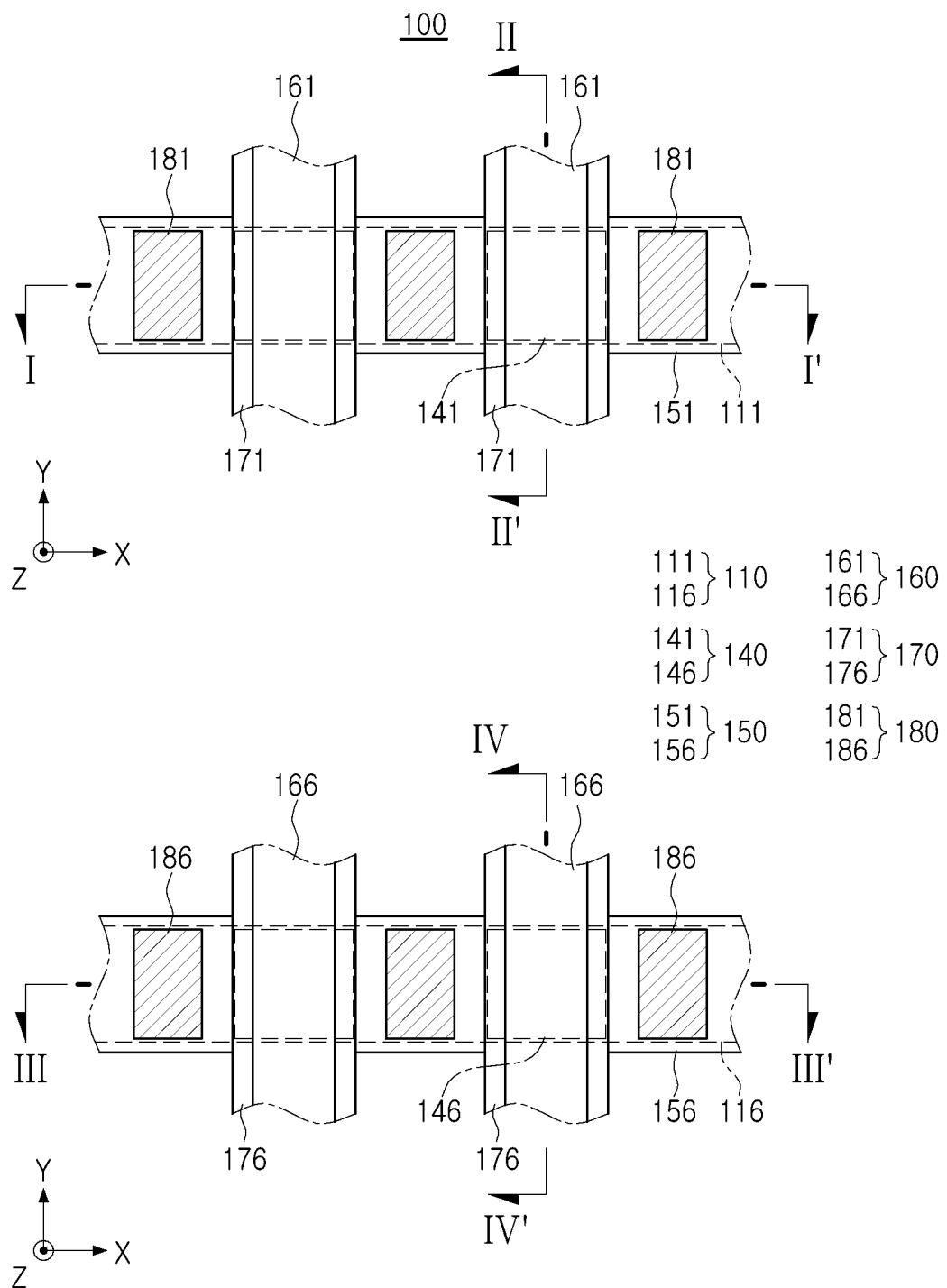
FIG. 1 is a plan view of a semiconductor device according to an embodiment of the inventive concept.

In order to overcome a performance reduction of operating characteristics in a semiconductor device due to a reduction in size of planar metal oxide semiconductor FETs included in a semiconductor devices with fine patterns, a semiconductor device may include a transistor that includes a three-dimensional channel structure, such as a FinFET. An embodiment of the inventive concept provides a semiconductor device having a reduced channel layer loss achieved by strengthening an etch resistance of an uppermost channel layer of the semiconductor device. The etch resistance may be increased by including a material in the uppermost channel layer that is different from a material included in a lower channel layer of the semiconductor device.

Embodiments of the inventive concept will be described more fully hereinafter with reference to the accompanying drawings.

It will be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

As used herein, the singular forms "a," "an" and "the" are intended to include the plural forms as well, unless the context clearly indicates otherwise.

Herein, when one value is described as being about equal to another value or being substantially the same as or equal to another value, it is to be understood that the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of ordinary skill in the art. Further, it is to be understood that while parameters may be described herein as having "about" a certain value, according to embodiments of the inventive concept, the parameter may be exactly the certain value or approximately the certain value within a measurement error as would be understood by a person having ordinary skill in the art.

Figure 2A:
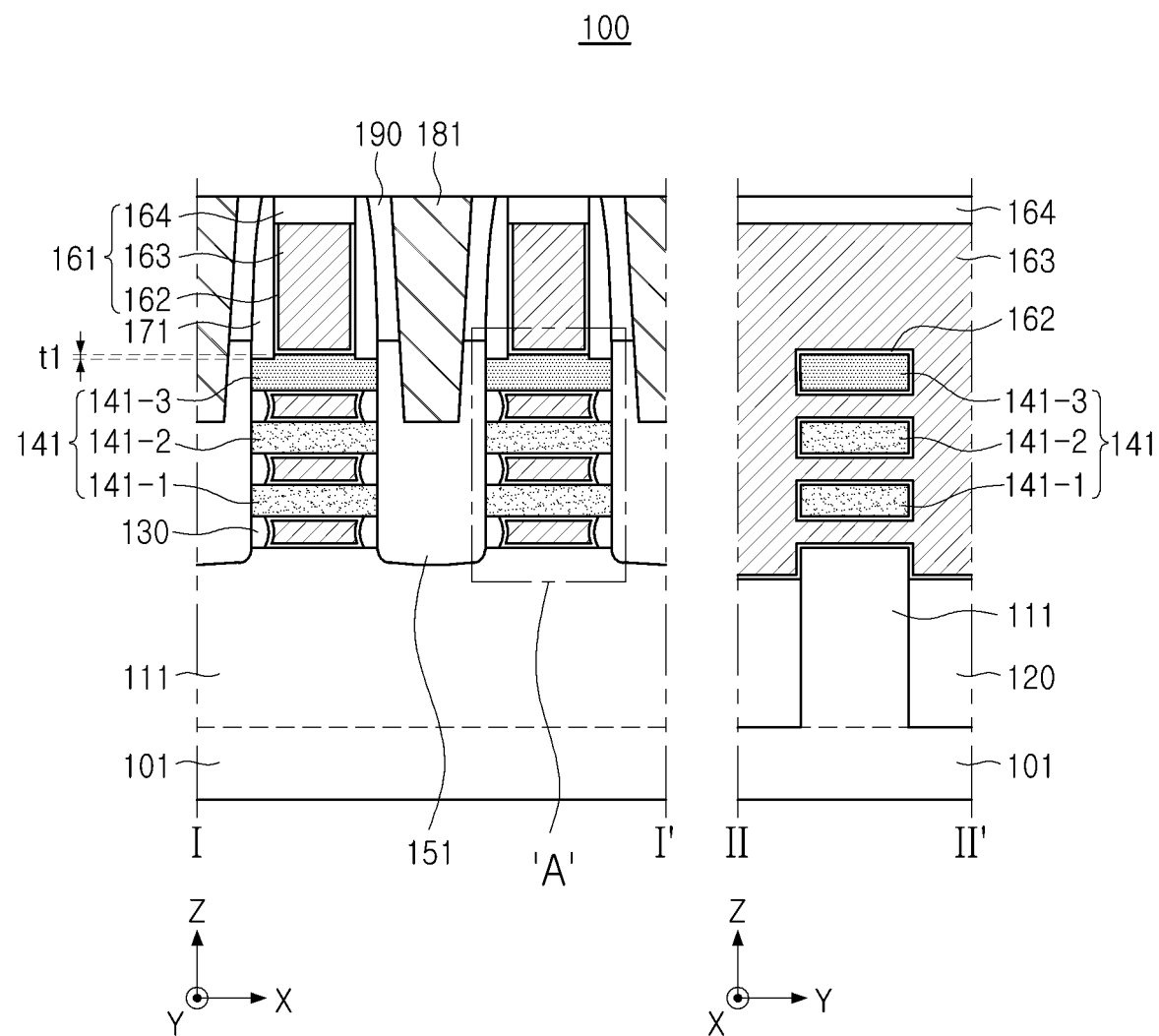
FIGS. 2A and 2B are cross-sectional views of a semiconductor device according to an embodiment of the inventive concept.
Figure 2B:
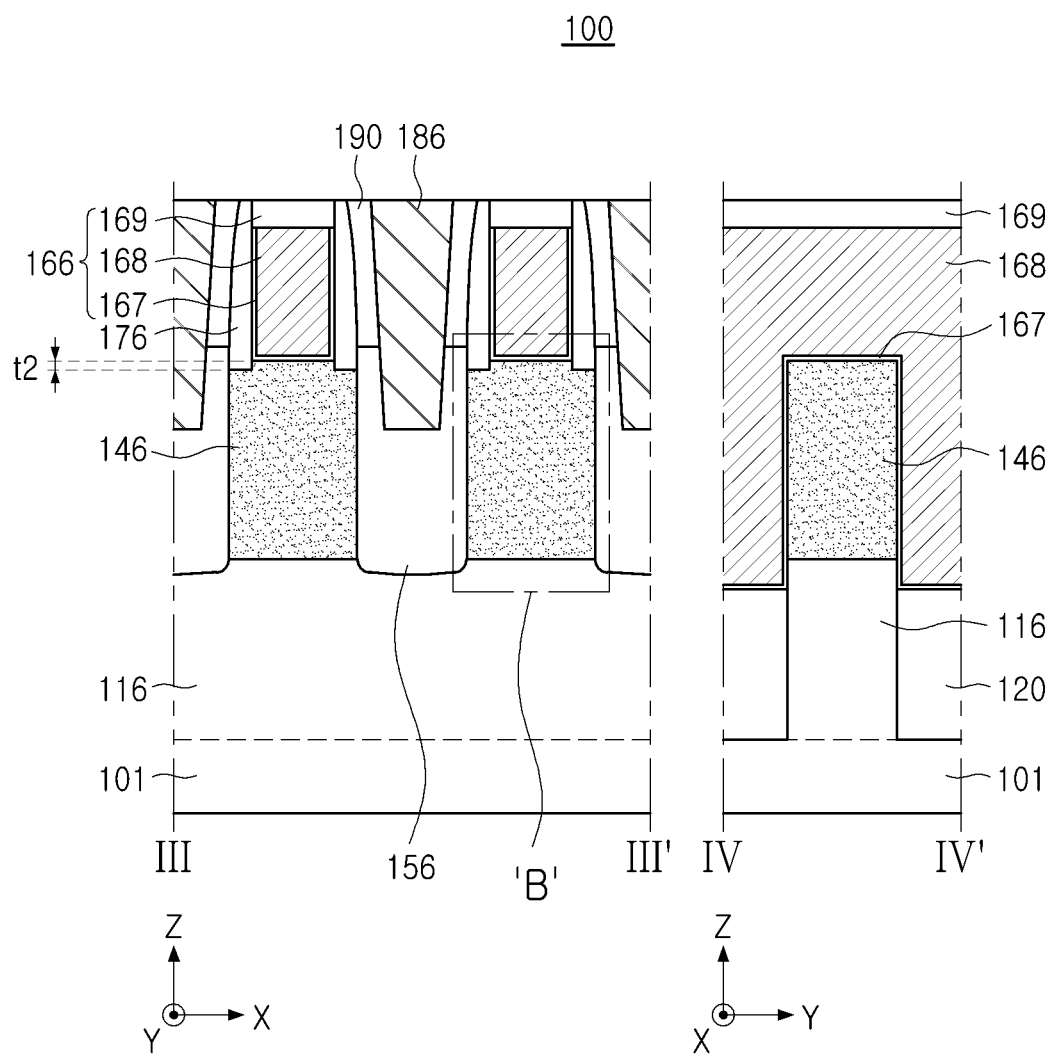

FIG. 1 is a plan view of a semiconductor device 100 according to an embodiment of the inventive concept. FIGS. 2A and 2B are cross-sectional views of the semiconductor device 100 of FIG. 1. FIG. 2A illustrates cross-sections of the semiconductor device 100 of FIG. 1 taken along lines I-I' and FIG. 2B illustrates cross-sections of the semiconductor device 100 of FIG. 1 taken along lines and IV-IV'.

Referring to FIGS. 1 to 2B, the semiconductor device 100 includes a substrate 101, active regions 110 disposed on the substrate 101, channel structures 140 disposed on the active regions 110, source/drain regions 150 disposed on the active regions 110 and contacting the channel structures 140, gate structures 160 disposed on the substrate 101 and intersecting the active regions 110, spacer structures 170 disposed on both sidewalls of the gate structures 160, and contact plugs 180 connected to the source/drain regions 150. The semiconductor device 100 may further include device isolation layers 120, inner spacer layers 130, and an interlayer insulating layer 190.

According to an embodiment, the semiconductor device 100 may include a first transistor that includes a first active region 111, a plurality of first channel layers 141, first source/drain region 151, a first gate structure 161, first spacer structures 171, and a first contact plug 181. According to an embodiment, the semiconductor device 100 may include a second transistor that includes a second active region 116, a second channel layer 146, a second source/drain region 156, a second gate structure 166, second spacer structures 176, and a second contact plug 186.

In the first transistor, the first active region 111 may be implemented as a fin structure. For example, the first active region 111 may be fin-shaped. In some embodiments, the gate electrode 163 of the first gate structure 161 may be disposed between the first active region 111 and the plurality of first channel layers 141. In some embodiments, the gate electrode 163 of the first gate structure 161 may be disposed between proximate pairs of first channel layers of the plurality of first channel layers 141. In some embodiments, the gate electrode 163 of the first gate structure 161 may be disposed on the plurality of first channel layers 141. Accordingly, in an embodiment, the first transistor may be implemented as a multi bridge channel FET (MBCFET™), which is an example of a gate-all-around (GAA) type FET, formed to include the plurality of first channel layers 141, the first source/drain region 151, and the first gate structure 161.

In the second transistor, the second active region 116 may be implemented as a fin structure. For example, the second active region 116 may be fin-shaped. In some embodiments, the second gate electrode 168 of the second gate structure 166 may cover the second active region 116 and at least a portion of the second channel layer 146 disposed on the active region 116. Accordingly, in an embodiment, the second transistor may be implemented as a fin-type FET formed to include the second channel layer 146, the second source/drain region 156, and the second gate structure 166.

A threshold voltage of the first transistor may be smaller than (e.g., less than) a threshold voltage of the second transistor.

The substrate 101 may include an upper surface extending in a first horizontal direction (i.e., an X-direction) and a second horizontal direction (i.e., a Y-direction) that is perpendicular to the first horizontal direction. The substrate 101 may include a semiconductor material such as a group IV semiconductor material, a group III-V compound semiconductor material, or a group II-VI compound semiconductor material. For example, the group IV semiconductor material may include silicon, germanium, or silicon-germanium. The substrate 101 may be provided as a bulk wafer, an epitaxial layer, a silicon on insulator (SOI) layer, a semiconductor on insulator (SeOI) layer, or the like.

The device isolation layers 120 may at least partially surround portions of the active regions 110 in the substrate 101. In some embodiments, the device isolation layers 120 may be formed by a shallow trench isolation (STI) process. In some embodiments, the device isolation layers 120 may include a region extending to a lower portion of the substrate 101, where the device isolation layers 120 may be arranged in a stepped fashion at different heights from each other. The device isolation layers 120 may at least partially expose upper portions of the active regions 110. In some embodiments, the device isolation layers 120 may include a curved upper surface that curves toward the active regions 110. The device isolation layers 120 may be formed of an insulating material. The device isolation layers 120 may include, for example, oxide, nitride, or a combination thereof.

Portions of the active regions 110 may be at least partially surrounded by the device isolation layers 120 in the substrate 101 and may extend in a first horizontal direction parallel to the upper surface of the substrate 101 (e.g., the X-direction). Portions of the active regions 110 may protrude from the substrate 101. Upper ends of the active regions 110 may protrude by a predetermined height above the upper surface of the device isolation layers 120 in a vertical direction perpendicular to the upper surface of the substrate 101 (e.g., the Z-direction). The active regions 110 may be formed as a portion of the substrate 101 or may include an epitaxial layer grown from the substrate 101. Portions of the active regions 110 that are not disposed directly under the gate structures 160 are partially recessed (i.e., do not extend as far in the vertical direction as portions of the active regions 110 that are disposed directly under the gate structures 160), and the source/drain regions 150 may be disposed on the recessed portions of the active regions 110.

The active regions 110 may include a first active region 111 of the first transistor and a second active region 116 of the second transistor, where the second active region 116 is spaced apart from the first active region 111. In some embodiments, the first active region 111 may extend in a direction parallel to a direction in which the second active region 116 extends. In some embodiments, the first active region 111 may extend in a direction that is not parallel to a direction in which the second active region 116 extends.

The channel structures 140 may include the plurality of first channel layers 141 of the first transistor and the second channel layer 146 of the second transistor.

The plurality of first channel layers 141 may include two or more channel layers of a plurality of channel layers 141-1, 141-2, and 141-3 spaced apart from each other on the first active region 111 in a direction perpendicular to the upper surface of the first active region 111 (e.g., the Z-direction). The plurality of first channel layers 141 may be connected to the first source/drain region 151 and may be spaced apart from the upper surface of the first active region 111. The plurality of first channel layers 141 and the first active region 111 may have a same or similar width in the second horizontal direction (i.e., the Y-direction). The plurality of first channel layers 141 may and the first gate structure 161 may have a same or similar width in the first horizontal direction (i.e., the X-direction).

The plurality of first channel layers 141 may include at least one first lower channel layers 141-1 and 141-2 and a first uppermost channel layer 141-3 disposed on the first lower channel layers 141-1 and 141-2.

The first uppermost channel layer 141-3 may include an upper surface portion contacting the first gate structure 161 and may include an upper surface portion contacting the first spacer structures 171. The upper surface portion contacting the first gate structure 161 may be disposed higher in the vertical direction (i.e., the Z-direction) than the upper surface portion contacting the first spacer structures 171.

The first lower channel layers 141-1 and 141-2 may be formed of a semiconductor material and may include, for example, at least one of silicon (Si), silicon germanium (SiGe), and germanium (Ge). The first uppermost channel layer 141-3 may include a material that is different from a material included in the first lower channel layers 141-1 and 141-2. The first lower channel layers 141-1 and 141-2 may include, for example, silicon (Si), and the first uppermost channel layer 141-3 may include silicon carbide (SiC), silicon germanium carbide (SiGeC), or a combination thereof. That is, unlike the first lower channel layers 141-1 and 141-2, the first uppermost channel layer 141-3 may include a doping element such as carbon in silicon (Si). The composition of carbon (C) in the first uppermost channel layer 141-3 may range from about 0.5% to about 3% by weight or by mass. If a concentration of carbon (C) in the uppermost channel layer 141-3 is higher than the above range, the electrical properties of the channel layer may deteriorate, and if the concentration of carbon (C) is lower than the above range, resistance to channel layer loss during a manufacturing process of the semiconductor device may be reduced.

Figure 11A:
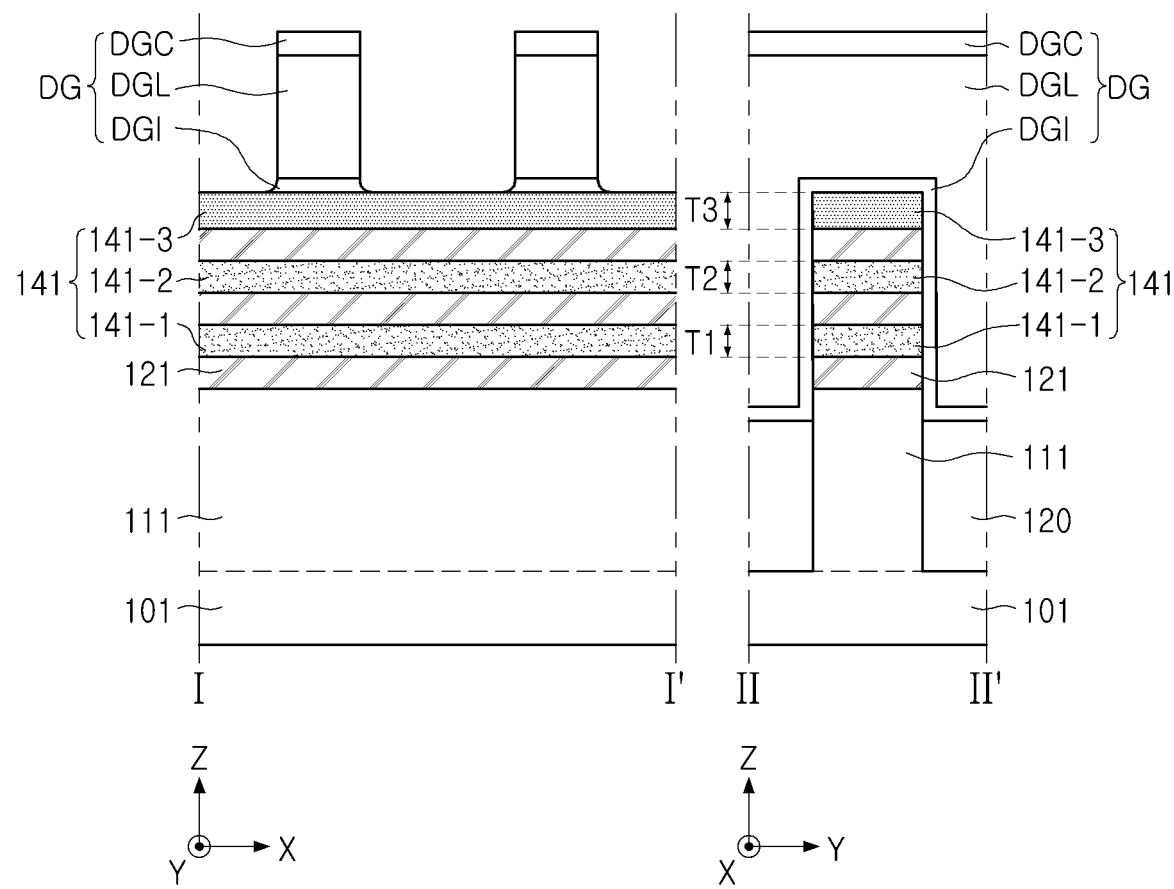
Figure 12A:
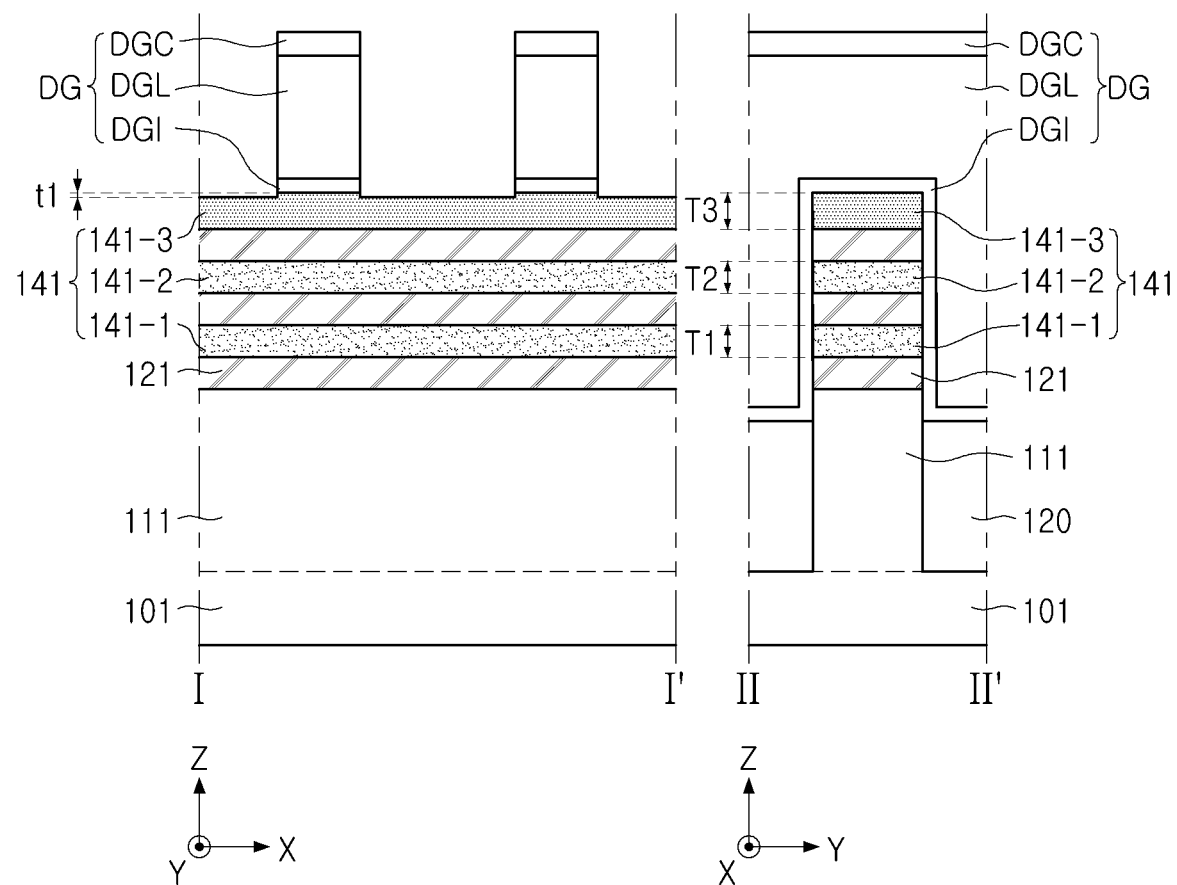

During the manufacturing process of the semiconductor device 100, a sacrificial gate insulating layer DGI (see FIG. 11A) is disposed on the first uppermost channel layer 141-3, and then a protrusion of the sacrificial gate insulating layer DGI is etched, as illustrated in FIG. 12A. Unlike the first lower channel layers 141-1 and 141-2, the first uppermost channel layer 141-3 includes carbon (C) having strong etch resistance, and thus, channel layer loss may be mitigated. Accordingly, a thickness of the first uppermost channel layer 141-3 may be easily adjusted and a volume of the channel layer may be secured.

The number of the channel layers 141-1, 141-2, and 141-3 constituting the plurality of first channel layers 141 may be variously changed in embodiments. For example, in some embodiments, the plurality of first channel layers 141 may further include a channel layer disposed on the upper surface of the first active region 111.

The second channel layer 146 may be a single channel layer disposed on the upper surface of the second active region 116. The second channel layer 146 may be connected to the second source/drain region 156 and may contact the upper surface of the second active region 116. The second channel layer 146 and the second active region 116 may have a same or similar width in the second horizontal direction (i.e., the Y-direction). The second channel layer 146 may have a thickness in the vertical direction (i.e., the Z-direction) that is greater than the sum of the thicknesses of the first channel layers of the plurality of first channel layers 141 in the vertical direction.

The second channel layer 146 may include an upper surface portion contacting the second gate structure 166 and may include an upper surface portion contacting the second spacer structures 176. The upper surface portion contacting the second gate structure 166 may be disposed higher in the vertical direction (i.e., the Z-direction) than the upper surface portion contacting the second spacer structures 176.

The second channel layer 146 may be formed of a semiconductor material and may include, for example, at least one of silicon (Si), silicon germanium (SiGe), and germanium (Ge). The second channel layer 146 may include a same material as is included in the first lower channel layers 141-1 and 141-2 and may include a material that is different from a material included in the first uppermost channel layer 141-3. For example, the second channel layer 146 and the first lower channel layers 141-1 and 141-2 may include silicon (Si), and the first uppermost channel layer 141-3 may include silicon carbide (SiC).

A first difference t1 between a height in the vertical direction of the upper surface portion of the first uppermost channel layer 141-3 contacting the first gate structure 161 and a height in the vertical direction of the upper surface portion of the first uppermost channel layer 141-3 contacting the first spacer structures 171 may be less than a second difference t2 between a height in the vertical direction of the upper surface portion of the second channel layer 146 contacting the second gate structure 166 and a height in the vertical direction of the upper surface portion of the second channel layer 146 contacting the second spacer structures 176. The first difference t1 may be less than the second difference t2 may because, during the sacrificial gate insulating layer DGI etching process (see FIGS. 12A and 12B), the first uppermost channel layer 141-3 includes a material having higher etch resistance than a material included in the second channel layer 146.

The source/drain regions 150 may include a first source/drain region 151 of the first transistor and a second source/drain region 156 of the second transistor.

The first source/drain region 151 may be disposed on the first active region 111 on at least one side of the plurality of first channel layers 141. The first source/drain region 151 may partially cover an upper surface of the first active region 111 that is disposed between side surface of each first channel layer of the plurality of first channel layers 141. The first source/drain region 151 may contact the plurality of first channel layers 141. In some embodiments, the first source/drain region 151 may be disposed in a recess of an upper portion of the first active region 111. In some embodiments, a depth in the vertical direction of the recess of the upper portion of the first active region 111 may be variously changed.

The first source/drain region 151 may be a semiconductor layer that includes silicon (Si), and may be formed of an epitaxial layer. The first source/drain region 151 may include impurities of different types and/or concentrations. For example, the first source/drain region 151 may include n-type doped silicon (Si) and/or p-type doped silicon germanium (SiGe). In some embodiments, the first source/drain region 151 may have a merged shape in which adjacent portions of the first source/drain region 151 in the Y-direction are connected to each other in the first active region 111.

The second source/drain region 156 may be disposed on the second active region 116 on at least one side of the second channel layer 146. The second source/drain region 156 may cover an upper surface of the second active region 116 on a side surface of the second channel layer 146 and at a lower end of the second source/drain region 156. The second source/drain region 156 may contact the second channel layer 146. In some embodiments, the second source/drain region 156 may be disposed in a recess of an upper portion of the second active region 116. In some embodiments, a depth in the vertical direction of the recess of the upper portion of the second active region 116 may be variously changed. The second source/drain region 156 may be a semiconductor layer that includes silicon (Si) and may include impurities of different types and/or concentrations. For example, the second source/drain region 156 may include n-type doped silicon (Si) and/or p-type doped silicon germanium (SiGe).

In some embodiments, the first source/drain region 151 and the second source/drain region 156 may include the same type of impurities as each other. In some embodiments, the first source/drain region 151 and the second source/drain region 156 may include different types of impurities from each other. When the first source/drain region 151 and the second source/drain region 156 include different types of impurities, for example, the first source/drain region 151 may be doped with n-type impurities and the second source/drain region 156 may be doped with p-type impurities.

The gate structures 160 may include a first gate structure 161 of the first transistor and a second gate structure 166 of the second transistor.

The first gate structure 161 may extend in a direction (for example, the second horizontal direction) and may cross the first active region 111 and the first channel layers 141 on the first active region 111. Channel regions of the first transistor may be formed in regions of the first active region 111 and/or the plurality of first channel layers 141 intersecting the first gate structure 161.

The first gate structure 161 may include a first gate electrode 163, a first gate dielectric layer 162 disposed between the first gate electrode 163 and the first channel layers 141-1, 141-2, and 141-3, where each of the first channel layers 141-1, 141-2, and 141-3 are surrounded by the first gate dielectric layer 162, and a first gate capping layer 164 disposed on an upper surface of the first gate electrode 163. In some embodiments, upper and lower surfaces of the first gate structure 161 disposed between the first channel layers 141-1, 141-2, and 141-3 may contact the first channel layers 141-1, 141-2, and 141-3).

The first gate dielectric layer 162 may be disposed between the first active region 111 and the first gate electrode 163 and between each first channel layer of the plurality of first channel layers 141 and the first gate electrode 163 and may cover at least some surfaces of the first gate electrode 163. For example, the first gate dielectric layer 162 may surround bottom and side surfaces of the first gate electrode 163 and may expose an upper surface of the first gate electrode 163. In some embodiments, the first gate dielectric layer 162 may be disposed between the first gate electrode 163 and the first spacer structures 171. In some embodiments, the first gate dielectric layer 162 may be omitted between the first gate electrode 163 and the first spacer structures 171. The first gate dielectric layer 162 may include oxide, nitride, or a high-κ material. The high-κ material may refer to a dielectric material having a dielectric constant higher than that of silicon oxide ($SiO_2$). The high-κ material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The first gate electrode 163 may be disposed on the first active region 111, between the first active region 111 and the plurality of first channel layers 141, between proximate pairs of first channel layers of the plurality of first channel layers 141, and between the first gate capping layer 164 and the plurality of first channel layers 141, and may extend above the plurality of first channel layers 141. The first gate electrode 163 may be spaced apart from the first channel layers 141-1, 141-2, and 141-3 by the first gate dielectric layer 162. For example, the first gate electrode may surround each first channel layer of the plurality of first channel layers 141, and the first gate dielectric layer 162 may be disposed between each first channel layer of the plurality of first channel layers 141 and the first gate electrode 163.

The first gate electrode 163 may include a conductive material (for example, a metal nitride such as titanium nitride (TiN), tantalum nitride (TaN), or tungsten nitride (WN), and/or aluminum (Al)); a metal material such as tungsten (W) or molybdenum (Mo); or a semiconductor material such as doped polysilicon. The first gate electrode 163 may be formed of two or more multi-layers. In some embodiments, a first gate electrode 163 in a first transistor may be separated from a first gate electrode 163 disposed in an adjacent first transistor by a separator disposed between at the adjacent first transistors.

The first gate capping layer 164 may be disposed on the first gate electrode 163, a lower surface of the first gate capping layer 164 may be surrounded by the first gate electrode 163, and side surfaces of the first gate capping layer 164 may be surrounded by the first spacer structures 171.

The second gate structure 166 may extend in a direction (for example, the second horizontal direction) and may cross the second active region 116 and the second channel layer 146 on the second active region 116. Channel regions of the second transistor may be formed in regions of the second active region 116 and/or the second channel layer 146 intersecting the second gate structure 166.

The second gate structure 166 may include a second gate electrode 168, a second gate dielectric layer 167 disposed between the second gate electrode 168 and the second channel layer 146, and a second gate capping layer 169 disposed on an upper surface of the second gate electrode 168.

The second gate dielectric layer 167 may be disposed between the second channel layer 146 and the second gate electrode 168, and may cover at least some surfaces of the second gate electrode 168. In some embodiments, the second gate dielectric layer 167 may be disposed between the second gate electrode 168 and the second spacer structures 176. In some embodiments, the second gate dielectric layer 167 may be omitted between the second gate electrode 168 and the second spacer structures 176. The second gate dielectric layer 167 may include an oxide, a nitride, or a high-κ material similar to the first gate dielectric layer 162.

The second gate electrode 168 may extend upwardly from the second active region 116 along side surfaces of the second channel layer 146, and may extend upwardly from a top surface of the second channel layer 146. For example, the second active region 116 may partially surround the second channel layer 146. The second gate electrode 168 may be spaced apart from the second channel layer 146 by the second gate dielectric layer 167. For example, the second gate dielectric layer 167 may be disposed between the second gate electrode 168 and the second channel layer 146. The second gate electrode 168 may include a same conductive material as is included in the first gate electrode 163.

The second gate capping layer 169 may be disposed on the second gate electrode 168, a lower surface of the second gate capping layer 169 may be surrounded by the second gate electrode 168, and side surfaces of the second gate capping layer 169 may be surrounded by the second spacer structures 176.

The inner spacer layers 130 may be disposed in parallel with the first gate electrode 163 between proximate pairs of first channel layers of the plurality of first channel layers 141. Below the first uppermost channel layer 141-3, the first gate electrode 163 may be spaced apart and electrically separated from the first source/drain region 151 by the inner spacer layers 130. In some embodiments, a side surface of each inner spacer layers 130 facing the first gate electrode 163 may curve towards the first gate electrode 163. In some embodiments, a side surface of each inner spacer layer 130 facing the first gate electrode 163 is parallel to a side surface of the first gate electrode 163. The inner spacer layers 130 may be formed of oxide, nitride, or oxynitride. In some embodiments, the inner spacer layers 130 may be formed of a low-κ film. In some embodiments, the inner spacer layers 130 may be omitted.

The spacer structures 170 may include first spacer structures 171 of the first transistor and second spacer structures 176 of the second transistor.

The first spacer structures 171 may be disposed on both sidewalls of the first gate electrode 163 and may extend in the Z-direction perpendicular to the upper surface of the substrate 101. In some embodiments, the first spacer structures 171 are disposed on the uppermost first channel layer 141-3 and are omitted below the uppermost first channel layer 141-3 in the Z-direction. In some embodiments, each of the first spacer structures 171 may include a portion having a curved outer surface so that a width in the X-direction of an upper portion in the Z-direction is smaller than a width in the X-direction of a lower portion in the Z-direction. In some embodiments, the shape of the first spacer structures 171 may be variously changed. The first spacer structures 171 may insulate the first source/drain region 151 from the first gate electrode 163. The first spacer structures 171 may have a multi-layer structure according to embodiments. The first spacer structures 171 may be formed of at least one of oxide, nitride, and oxynitride.

The second spacer structures 176 may be disposed on both sidewalls of the second gate electrode 168 and may extend in the Z-direction, perpendicular to the upper surface of the substrate 101. The second spacer structures 176 may insulate the second source/drain region 156 from the second gate electrode 168. In some embodiments, the second spacer structures 176 may have a multi-layer structure. The second spacer structures 176 may be formed of at least one of oxide, nitride, and oxynitride.

The contact plugs 180 may extend through the interlayer insulating layer 190 to connect to the source/drain regions 150 and may apply an electrical signal to the source/drain regions 150. The contact plugs 180 may be disposed on the source/drain regions 150 as illustrated in FIG. 1, and in some embodiments, the contact plugs 180 may have a length in the Y-direction that is longer than a length of the source/drain regions 150 in the Y-direction. In some embodiments, the contact plugs 180 may be partially surrounded by the source/drain regions 150. In some embodiments, each contact plugs 180 may include an inclined side surface in which a width in the X-direction of a lower portion of the contact plugs 180 in the Z-direction is narrower than a width in the X-direction of an upper portion of the contact plugs 180 in the Z-direction according to an aspect ratio. In some embodiments, the inclined side surface of the contact plugs 180 may be omitted.

The contact plugs 180 may include, for example, a metal nitride such as titanium nitride (TiN), tantalum nitride (TaN), or tungsten nitride (WN), and/or a metal material such as aluminum (Al), tungsten (W), or molybdenum (Mo). In some embodiments, the contact plugs 180 may include a barrier layer disposed along interfaces with the source/drain regions 150. The barrier layer may include, for example, a metal nitride such as titanium nitride (TiN), tantalum nitride (TaN), or tungsten nitride (WN).

The contact plugs 180 may include a first contact plug 181 of the first transistor and a second contact plug 186 of the second transistor.

The first contact plug 181 may extend from an upper surface of the semiconductor device 100 in the Z-direction to below the first uppermost channel layer 141-3. In some embodiments, the first contact plug 181 may be recessed to a same height in the Z-direction as an upper surface of the first channel layer 141-2 adjacent to the first uppermost channel layer 141-3. In some embodiments, the first contact plug may be recessed to a different height in the Z-direction from the upper surface of the first channel layer 141-2.

In some embodiments, an upper portion of the first source/drain region 151 may include a recess, and a portion of the first contact plug 181 may be disposed in the recess. In some embodiments, the recess is omitted from the upper portion of the first source/drain region 151, and the first contact plug 181 may contact an upper surface of the first source/drain region 151.

In some embodiments, an upper portion of the second source/drain region 156 may include a recess, and a portion of the second contact plug 186 may be disposed in the recess. In some embodiments, the recess is omitted from the upper portion of the second source/drain region 156, and the second contact plug 186 may contact an upper surface of the second source/drain region 156.

The interlayer insulating layer 190 may at least partially cover the source/drain regions 150. In some embodiments, the interlayer insulating layer 190 may at least partially cover the gate structures 160. In some embodiments, the interlayer insulating layer 190 may partially cover the device isolation layers 120. The interlayer insulating layer 190 may include, for example, at least one of an oxide, a nitride, and an oxynitride. In some embodiments, the interlayer insulating layer 190 may include a low-κ material.

Figure 3A:
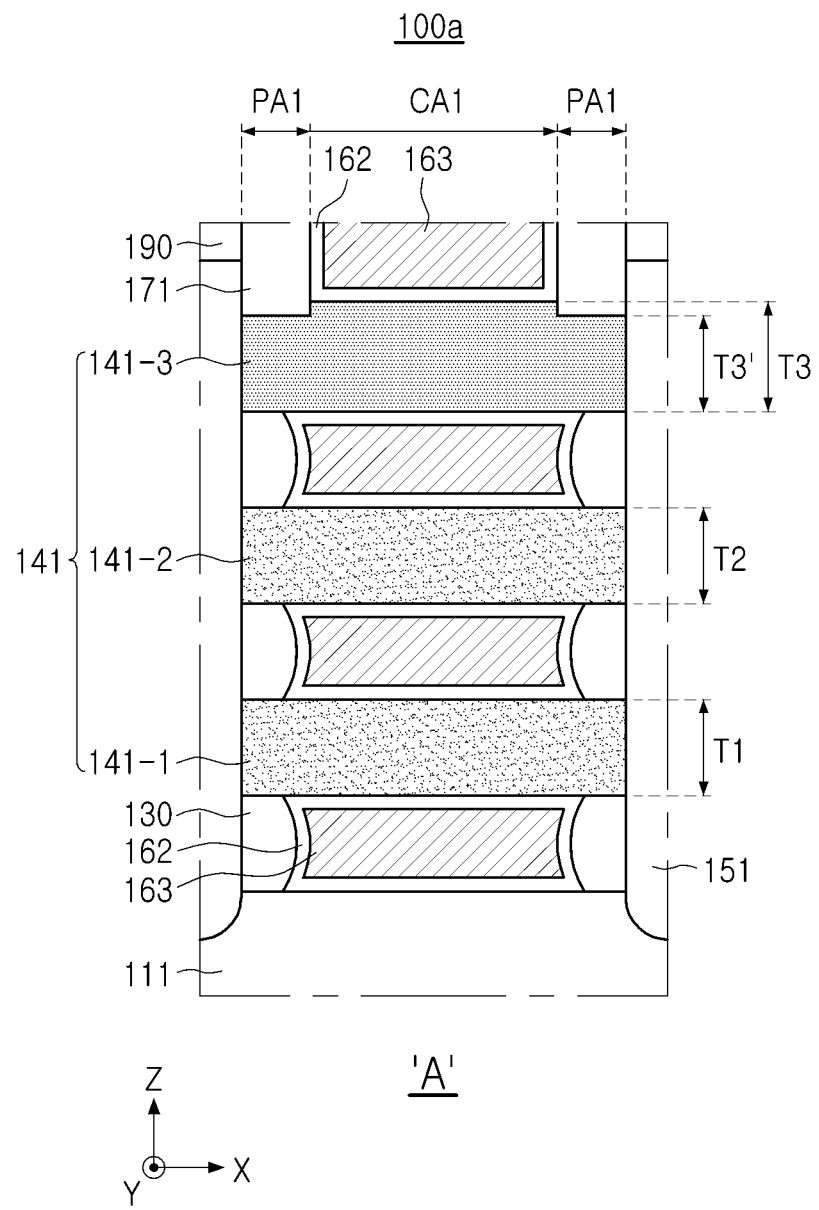
FIGS. 3A and 3B are partially enlarged views of a portion of a semiconductor device according to an embodiment of the inventive concept.
Figure 3B:
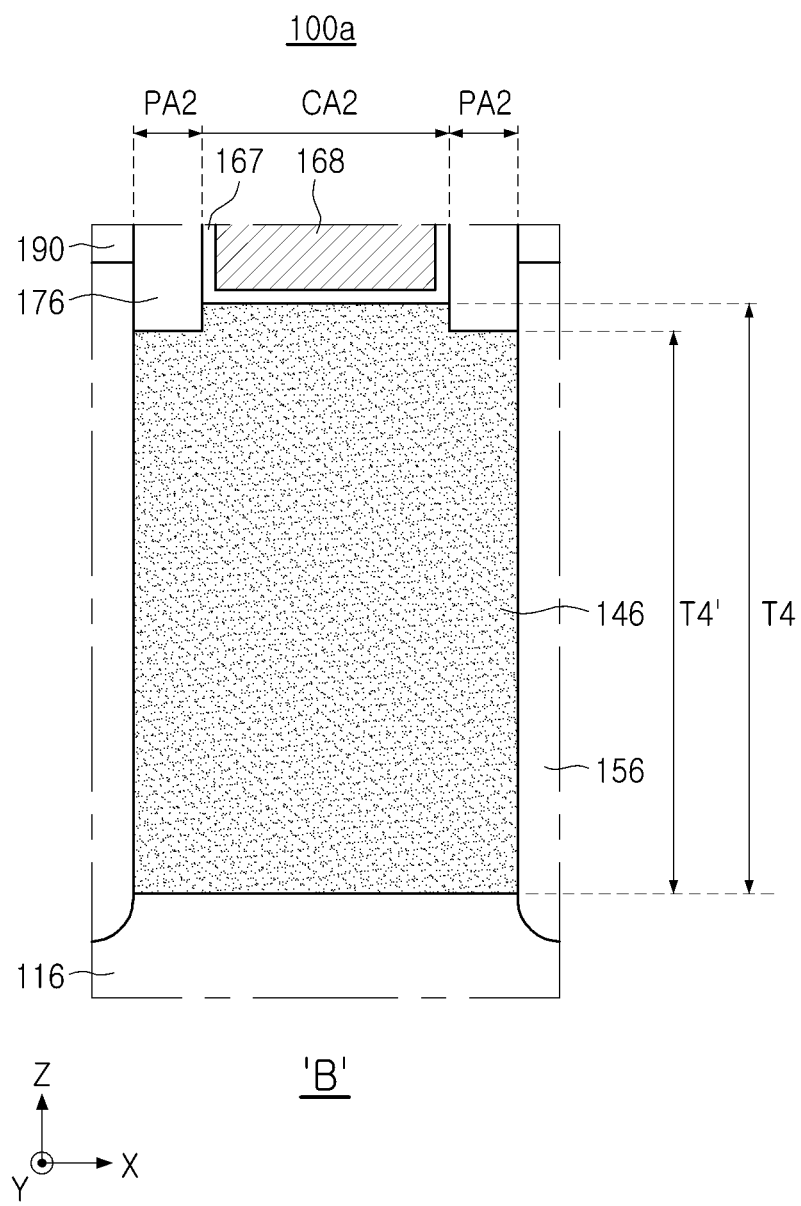

FIGS. 3A and 3B are partially enlarged views of a portion of a semiconductor device according to embodiments of the inventive concept. FIG. 3A is an enlarged view of region A of FIG. 2A, and FIG. 3B is an enlarged view of region B of FIG. 2B.

Referring to FIG. 3A, in a semiconductor device 100a, respective thicknesses in the Z-direction T1 and T2 of the first lower channel layers 141-1 and 141-2 may be substantially equal. A thickness T3 in the Z-direction of the first uppermost channel layer 141-3 may be greater than the respective thicknesses T1 and T2 of the first lower channel layers 141-1 and 141-2. In the present disclosure, "thickness" may refer to a maximum thickness or an average thickness of each component.

The first uppermost channel layer 141-3 may include a first central region CA1 overlapping the first gate structure 161 in the Z-direction and first peripheral regions PA1 disposed on both sides (e.g., opposing sides) of the first central region CA1 that extend in the Z-direction. The first peripheral regions PA1 may overlap the first spacer structures 171 in the Z-direction. In the first uppermost channel layer 141-3, a first thickness T3 in the Z-direction in the first central region CA1 may be greater than a second thickness T3' in the Z-direction in the first peripheral regions PAL The first thickness T3 may range, for example, from about 70 Å to about 120 Å. The second thickness T3' may range, for example, from about 50 Å to about 100 Å.

The first difference t1 (see FIG. 2A) may represent a difference between the first thickness T3 and the second thickness T3'. may The first difference t1 may be a thickness at which a channel layer loss occurs during an etching process of the sacrificial gate insulating layer DGI (see FIG. 12A). In some embodiments, the second thickness T3' may be substantially equal to the respective thicknesses T1 and T2 of the first lower channel layers 141-1 and 141-2. In some embodiments, the second thickness T3' may be greater than the thicknesses T1 and T2 of the first lower channel layers 141-1 and 141-2, respectively. Unlike the first lower channel layers 141-1 and 141-2, the first uppermost channel layer 141-3 includes carbon, and thus, a reduction in thickness of the first uppermost channel layer 141-3 in the sacrificial gate insulating layer (DGI) etching process may be minimized.

The first spacer structures 171 may overlap the first peripheral regions PA1 of the first uppermost channel layer 141-3 in the Z-direction, perpendicular to the upper surface of the substrate 101. In the first uppermost channel layer 141-3, an upper surface of the first central region CA1 of the first uppermost channel layer 141-3 may contact the first gate structure 161, and an upper surface of the first peripheral regions PA1 of the first uppermost channel layer 141-3 may contact the first spacer structures 171.

Referring to FIG. 3B, in the semiconductor device 100a, the second channel layer 146 may include a second central region CA2 overlapping the second gate structure 166 in the Z-direction and second peripheral regions PA2 disposed on both sides (e.g., opposing sides) of the second central region CA2 that extend in the Z-direction. The second peripheral regions PA2 may overlap the second spacer structures 176 in the Z-direction. In the second channel layer 146, a third thickness T4 in the second central region CA2 may be greater than a fourth thickness T4' in the second peripheral regions PA2. The second difference t2 (see FIG. 2B) may represent a difference between the third thickness T4 and the fourth thickness T4' may. The second difference t2 may be a thickness at which channel layer loss occurs during the sacrificial gate insulating layer DGI etching process (see FIG. 12B).

The second spacer structures 176 may overlap the second peripheral regions PA2 of the second channel layer 146 in the Z-direction, perpendicular to the upper surface of the substrate 101. In the second channel layer 146, an upper surface of the second central region CA2 may contact the second gate structure 166, and an upper surface of the second peripheral regions PA2 may contact the second spacer structures 176.

Referring to FIGS. 2A to 3B, the uppermost surface of the second channel layer 146 may be disposed at a same height in the Z-direction as the uppermost surface of the first uppermost channel layer 141-3. That is, the upper surface of the central region CA2 of the second channel layer 146 may be coplanar with the upper surface of the central region CA1 of the first uppermost channel layer 141-3. However, the upper surface of the peripheral regions PA2 of the second channel layer 146 may be disposed at a lower height in the Z-direction as the upper surface of the peripheral regions PA1 of the first uppermost channel layer 141-3. That is, the first difference t1 between the first thickness T3 and the second thickness T3' may be less than the second difference t2 between the third thickness T4 and the fourth thickness T4', and this may be because the first uppermost channel layer 141-3 includes a material having higher etch resistance than the second channel layer 146.

Figure 4:
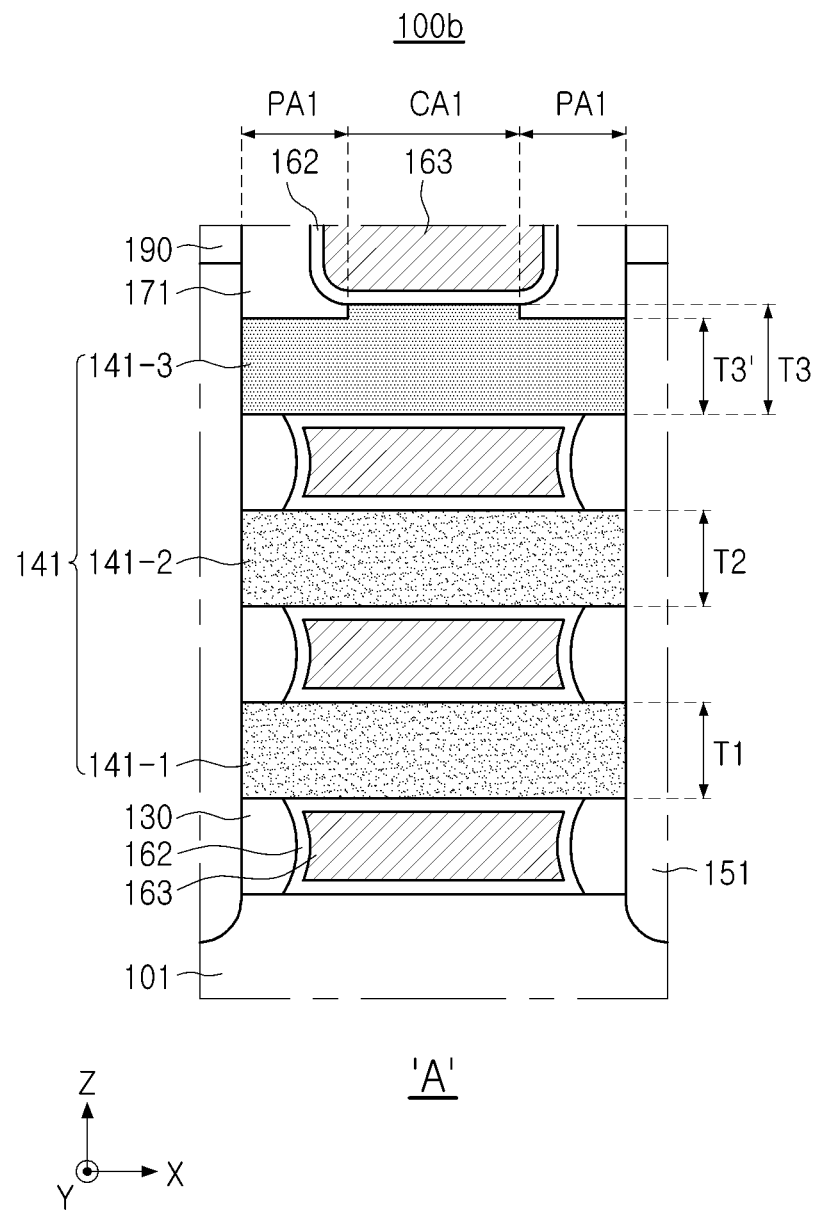
FIG. 4 is a partially enlarged view of a portion of a semiconductor device according to an embodiment of the inventive concept.
Figure 5:
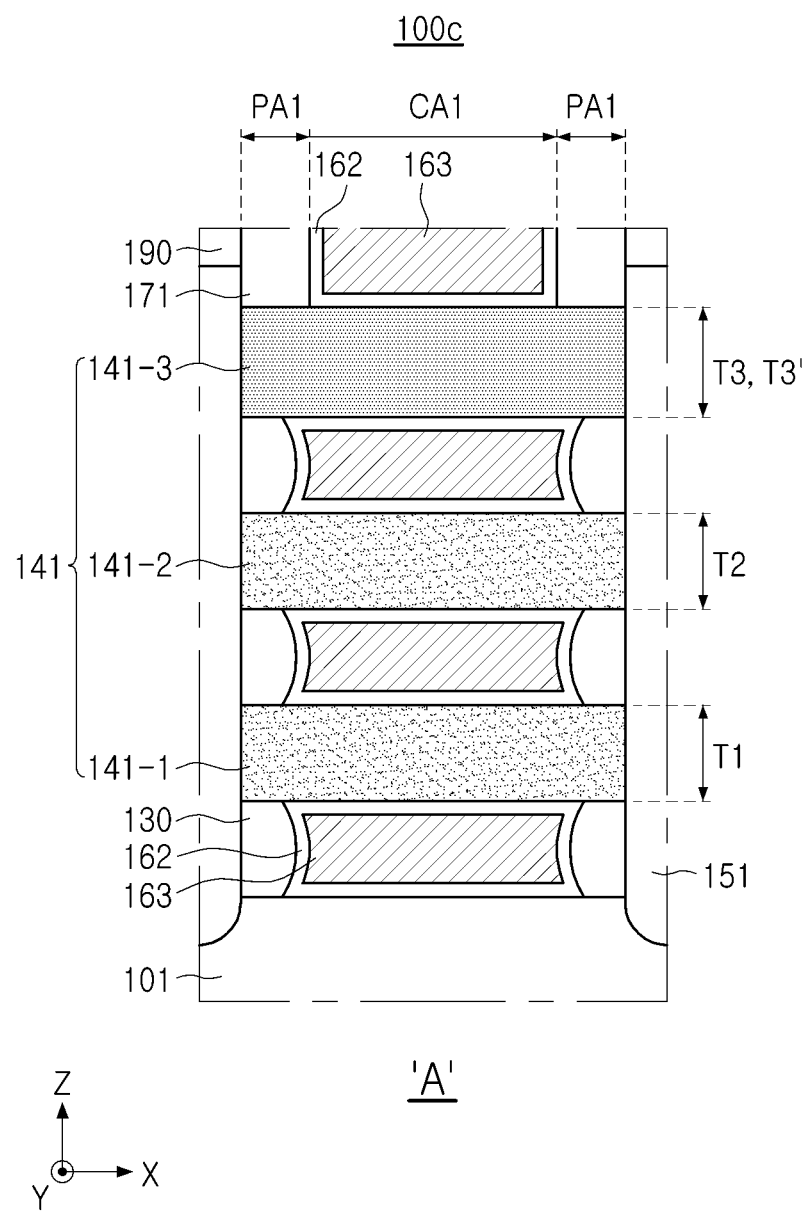
FIG. 5 is a partially enlarged view of a portion of a semiconductor device according to an embodiment of the inventive concept.
Figure 6:
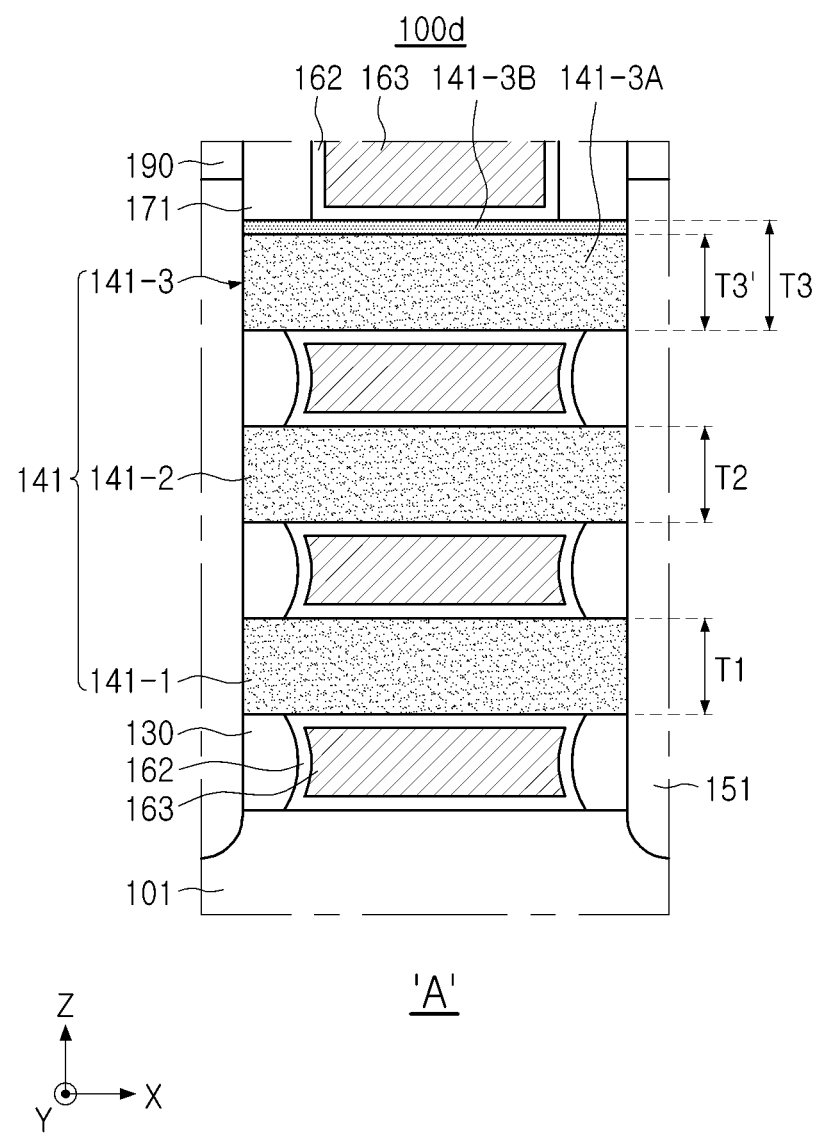
FIG. 6 is a partially enlarged view of a portion of a semiconductor device according to an embodiment of the inventive concept.

FIGS. 4 to 6 are partially enlarged views of a portion of a semiconductor device according to embodiments of the inventive concept. FIGS. 4 to 6 are enlarged views of a region corresponding to the region A of FIG. 2A.

Referring to FIG. 4, in a semiconductor device 100b, the first gate structure 161 (including the first gate dielectric layer 162 and the first gate electrode 163) on the first uppermost channel layer 141-3 may include sidewalls that are inclined at an obtuse angle from the bottom of the first gate structure 161. Accordingly, a width in the X-direction of an inclined sidewall at a lower end in the Z-direction may be smaller than a width in the X-direction of an inclined sidewall at an upper end in the Z-direction. For example, the inclined sidewalls of the first gate structure 161 may have a rounded shape. The inclined sidewalls of the first gate dielectric layer 162 may contact the first spacer structures 171. The inclined sidewalls of the first gate structure 161 are illustrated to have a rounded shape, but embodiments of the inventive concept are not necessarily limited thereto, and may in some embodiments, the inclined sidewalls of the first gate structure 161 may have, for example, a straight shape.

In contrast to the example illustrated by FIG. 3A, the first uppermost channel layer 141-3 of semiconductor device 100b may include a first central region CA1 that contacts the first gate structure 161 on the first uppermost channel layer 141-3 and may also include first peripheral regions PA1 disposed on both sides (e.g., opposing sides) of the first central region CA1 that extend in the Z-direction. In the first uppermost channel layer 141-3, a first thickness T3 of the first central region CA1 may be greater than a second thickness T3' of the first peripheral regions PA1. A width of the first central region CA1 of the first uppermost channel layer 141-3 in the X-direction may be less than a width of the first central region in FIG. 3A in the X-direction.

A bottom portion of the first gate structure 161 may contact the first uppermost channel layer 141-3, and the inclined sidewalls of the first gate structure 162 may contact the first spacer structures 171.

Referring to FIG. 5, in a semiconductor device 100c, the first uppermost channel layer 141-3 may include an upper surface disposed at substantially the same height in the Z-direction as the example illustrated in FIG. 3A. Similarly to the example illustrated in FIG. 3A, the first uppermost channel layer 141-3 may include a first central region CA1 overlapping the first gate structure 161 in the Z-direction and first peripheral regions PA1 disposed on both sides (e.g., opposing sides) of the first central region CA1 that extend in the Z-direction. However, in contrast to the example illustrated in FIG. 3A, a first thickness T3 in the first central region CA1 and a second thickness T3' in the first peripheral regions PA1 may be substantially the same. Since the first uppermost channel layer 141-3 includes carbon (C) to increase etch resistance, etching may be prevented in the sacrificial gate insulating layer DGI etching process (see FIG. 12). Accordingly, the first thickness T3 of the first central region CA1, which is not affected by the etching process, and the second thickness T3' of the second peripheral regions PA1, which is not affected by the etching process, may be substantially the same. In some embodiments, the first and second thicknesses T3 and T3' may be greater than the respective thicknesses in the Z-direction of the first lower channel layers 141-1 and 141-2. In some embodiments, the first and second thicknesses T3 and T3' may be equal to respective thicknesses in the Z-direction of the first lower channel layers 141-1 and 141-2.

Referring to FIG. 6, a first uppermost channel layer 141-3 of a semiconductor device 100d may include a plurality of channel layers. The plurality of channel layers may include a silicon layer 141-3A and a silicon carbide layer 141-3B disposed on the silicon layer 141-3A. An upper surface of the silicon layer 141-3A and a lower surface of the silicon carbide layer 141-3B may contact each other. The silicon carbide layer 141-3B may have a carbon composition of about 0.5% to about 3% by weight or by mass. In some embodiments, the silicon layer 141-3A may have a same thickness in the Z-direction as each of the first lower channel layers 141-1 and 141-2, and the silicon carbide layer 141-3B may have a thickness in the Z-direction that is less than the thickness of the silicon layer 141-3A. In some embodiments, the thicknesses of the silicon layer 141-3A and the silicon carbide layer 141-3B may be variously changed.

Although the thickness of the silicon carbide layer 141-3B is illustrated to be uniform, in an embodiment, a thickness in a region of the silicon carbide layer 141-3B overlapping the first gate structure 161 in the Z-direction may be thicker than a thickness in a region of the silicon carbide layer 141-3B that does not overlap the first gate structure 161 in the Z-direction.

Figure 7A:
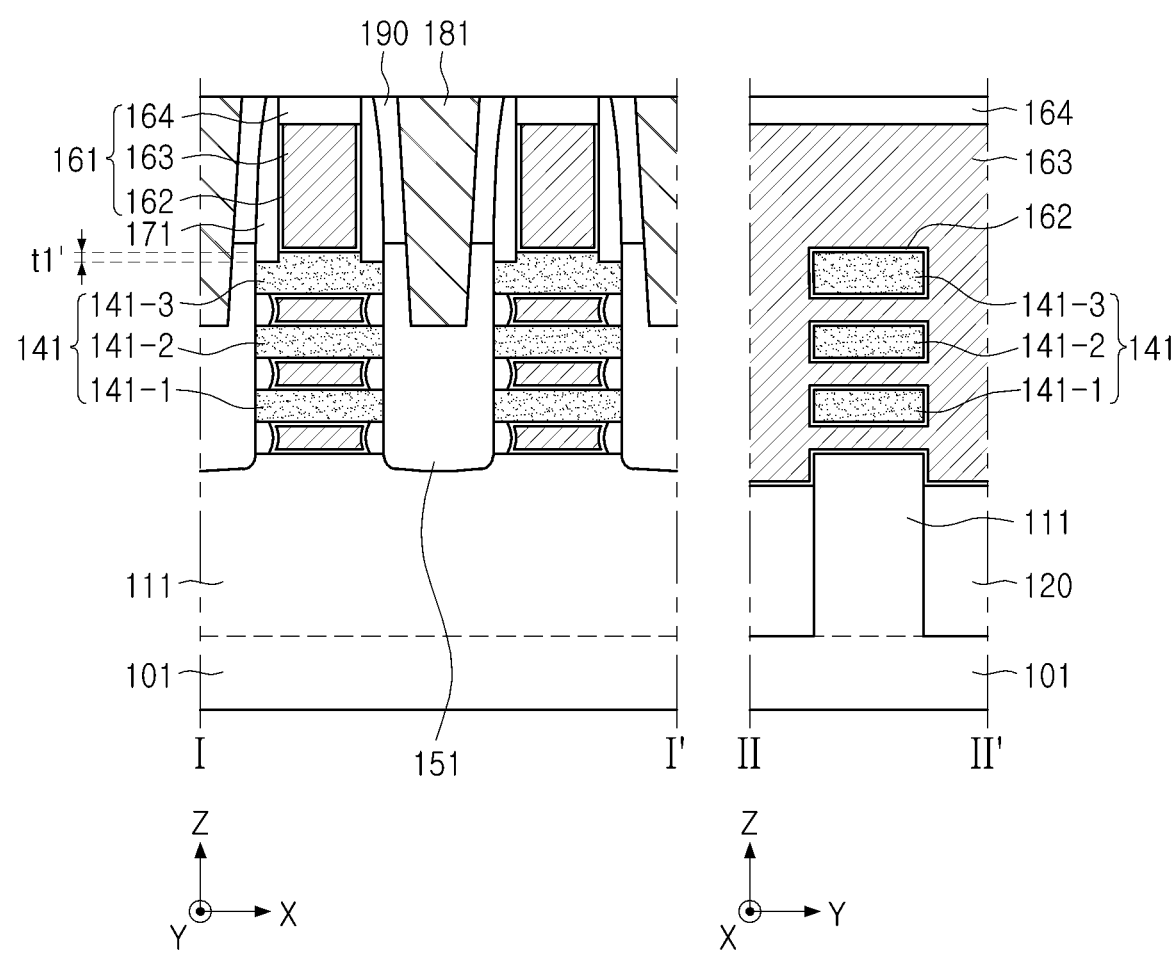
FIGS. 7A and 7B are cross-sectional views of semiconductor devices according to embodiments of the inventive concept.
Figure 7B:
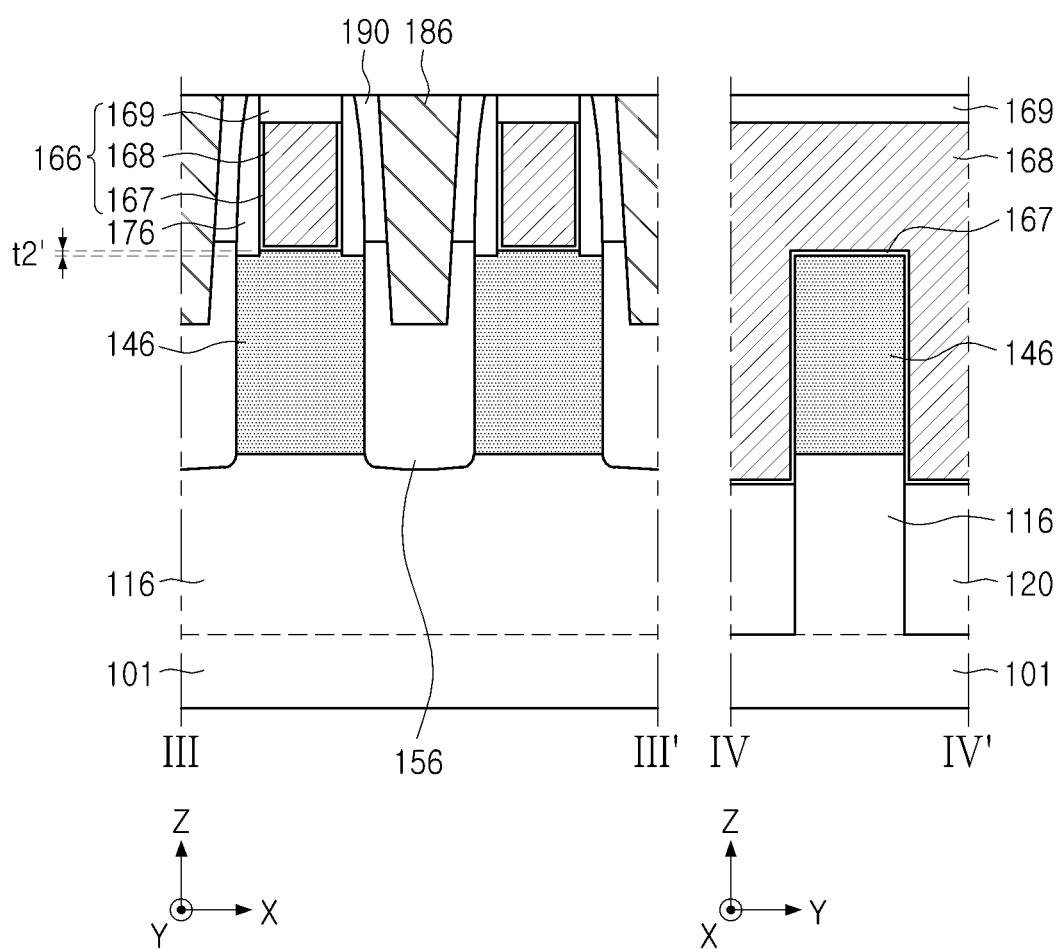

FIGS. 7A and 7B are cross-sectional views of a semiconductor device 200 according to embodiments of the inventive concept. FIG. 7A illustrates cross-sections of the semiconductor device 200 taken along lines I-I' and II-IF corresponding to lines I-I' and II-IF of FIG. 1. FIG. 7B illustrates cross-sections of the semiconductor device 200 taken along lines and IV-IV' corresponding to lines and IV-IV' of FIG. 1.

Referring to FIGS. 7A and 7B, the semiconductor device 200 may include channel structures 140 that differ from the examples illustrated by FIGS. 2A and 2B.

Referring to FIG. 7A, a plurality of first channel layers 141 may be formed of a semiconductor material, for example, at least one of silicon (Si), silicon germanium (SiGe), and germanium (Ge). Unlike in the example illustrated by FIG. 2A, the first channel layers of the plurality of first channel layers 141 may all include the same material. The first lower channel layers 141-1 and 141-2 and the first uppermost channel layer 141-3 may include, for example, silicon (Si).

In the first uppermost channel layer 141-3, a third difference t1' between a thickness in the Z-direction of the first central region CA1 (see FIG. 3A) and a thickness in the Z-direction of the first peripheral regions PA1 (see FIG. 3A) may be greater than a first difference t1 of FIG. 2A.

Referring to FIG. 7B, in contrast to the example illustrated in FIG. 2B, the second channel layer 146 may include silicon carbide, silicon germanium carbide, or a combination thereof.

In the second channel layer 146, a fourth difference t2' between a thickness in the Z-direction of the second central region CA2 (see FIG. 3B) and a thickness in the Z-direction of the second peripheral regions PA2 (see FIG. 3B) may be less than a second difference t2 of FIG. 2B.

In some embodiments, the third difference t1' may be greater than the fourth difference t2' because the second channel layer 146 includes carbon, which has strong etch resistance, unlike the first uppermost channel layer 141-3.

Figure 8A:
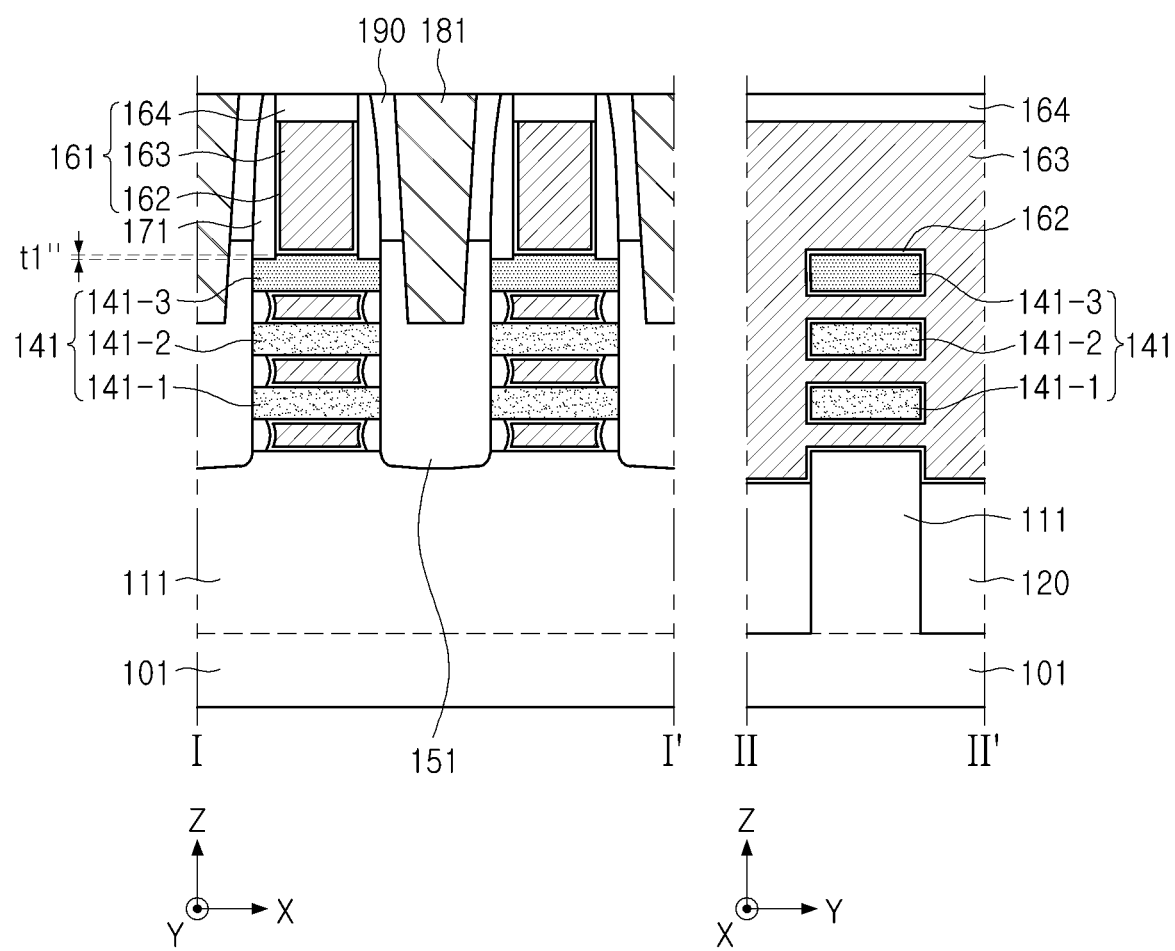
FIGS. 8A and 8B are cross-sectional views of semiconductor devices according to embodiments of the inventive concept.
Figure 8B:
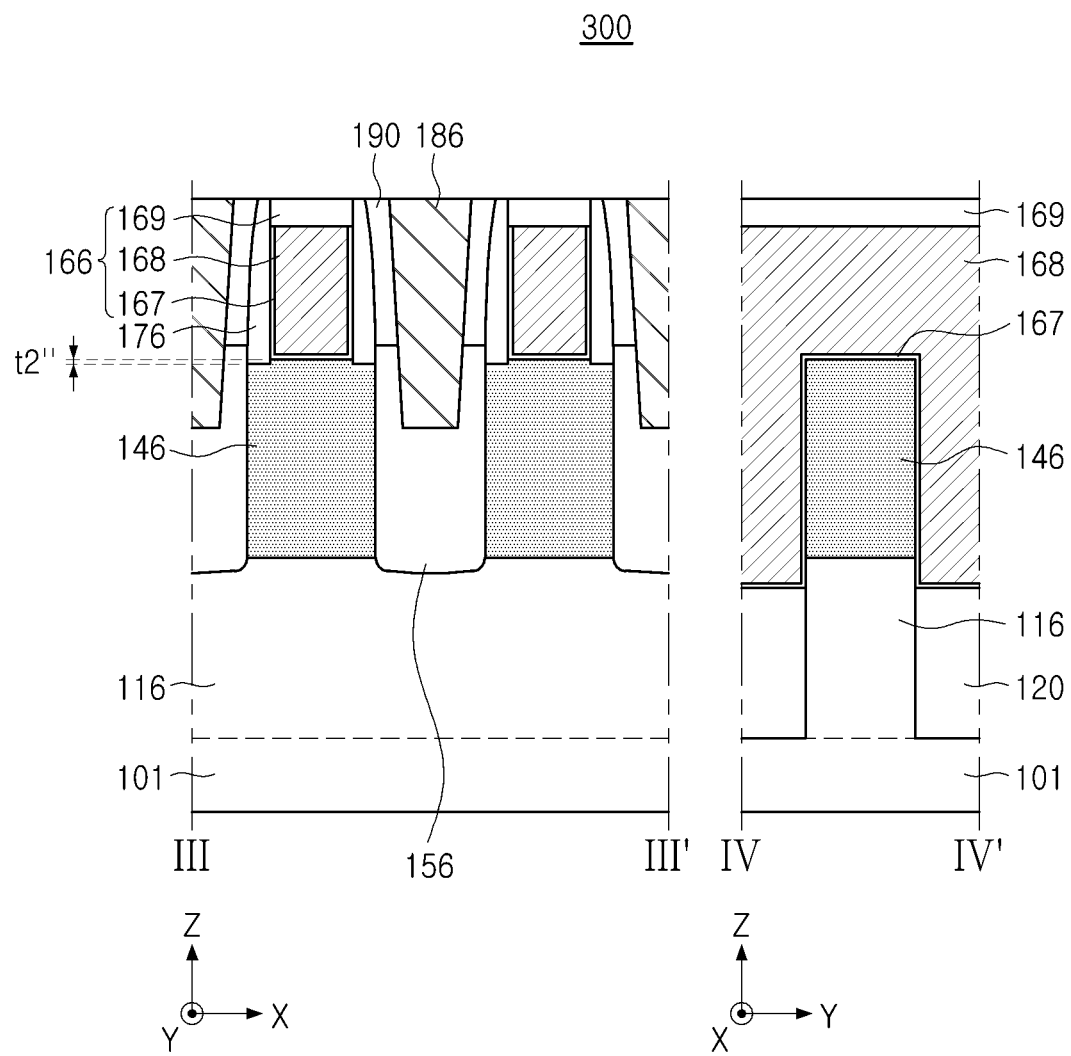

FIGS. 8A and 8B are cross-sectional views of a semiconductor device 300 according to embodiments of the inventive concept. FIG. 8A illustrates cross-sections of the semiconductor device 300 taken along lines I-I' and II-IF corresponding to lines I-I' and II-IF of FIG. 1. FIG. 8B illustrates cross-sections of the semiconductor device 300 taken along lines and IV-IV' corresponding to lines and IV-IV' of FIG. 1.

Referring to FIGS. 8A and 8B, the semiconductor device 300 may include channel structures 140 that differ from of the examples illustrated in FIGS. 2A and 2B.

Referring to FIG. 8A, the plurality of first channel layers 141 may be arranged in the same structure as the example illustrated in FIG. 2A. For example, the first uppermost channel layer 141-3 may include a material that is different from a material included in the first lower channel layers 141-1 and 141-2. In the first uppermost channel layer 141-3, a fifth difference t1" between a thickness in the Z-direction of the first central region CA1 (refer to FIG. 3A) and a thickness in the Z-direction of the first peripheral regions PA1 (refer to FIG. 3A) may be substantially equal to the first difference t1 of FIG. 2A.

Referring to FIG. 8B, the second channel layer 146 may be arranged in the same structure as the example illustrated in FIG. 7B. For example, the second channel layer 146 may include silicon carbide, silicon germanium carbide, or a combination thereof. In the second channel layer 146, a sixth difference t2" between a thickness in the Z-direction of the second central region CA2 (refer to FIG. 3B) and a thickness in the Z-direction of the second peripheral regions PA2 (refer to FIG. 3B) may be substantially equal to the fourth difference t2' of FIG. 7B.

The fifth difference t1" may be substantially equal to the sixth difference t2".

Referring to FIGS. 8A and 8B, the first uppermost channel layer 141-3 may include a same material as is included in the second channel layer 146. The first uppermost channel layer 141-3 and the second channel layer 146 may each include carbon, and a composition of the carbon may range from about 0.5% to about 3% by weight or by mass.

FIGS. 9A to 17B are diagrams illustrating a sequential process for manufacturing a semiconductor device according to embodiments of the inventive concept. FIGS. 9A to 17B illustrate a process for manufacturing the semiconductor device 100 of FIGS. 1 to 2B and illustrate cross-sections corresponding to FIGS. 2A and 2B.

Figure 9A:
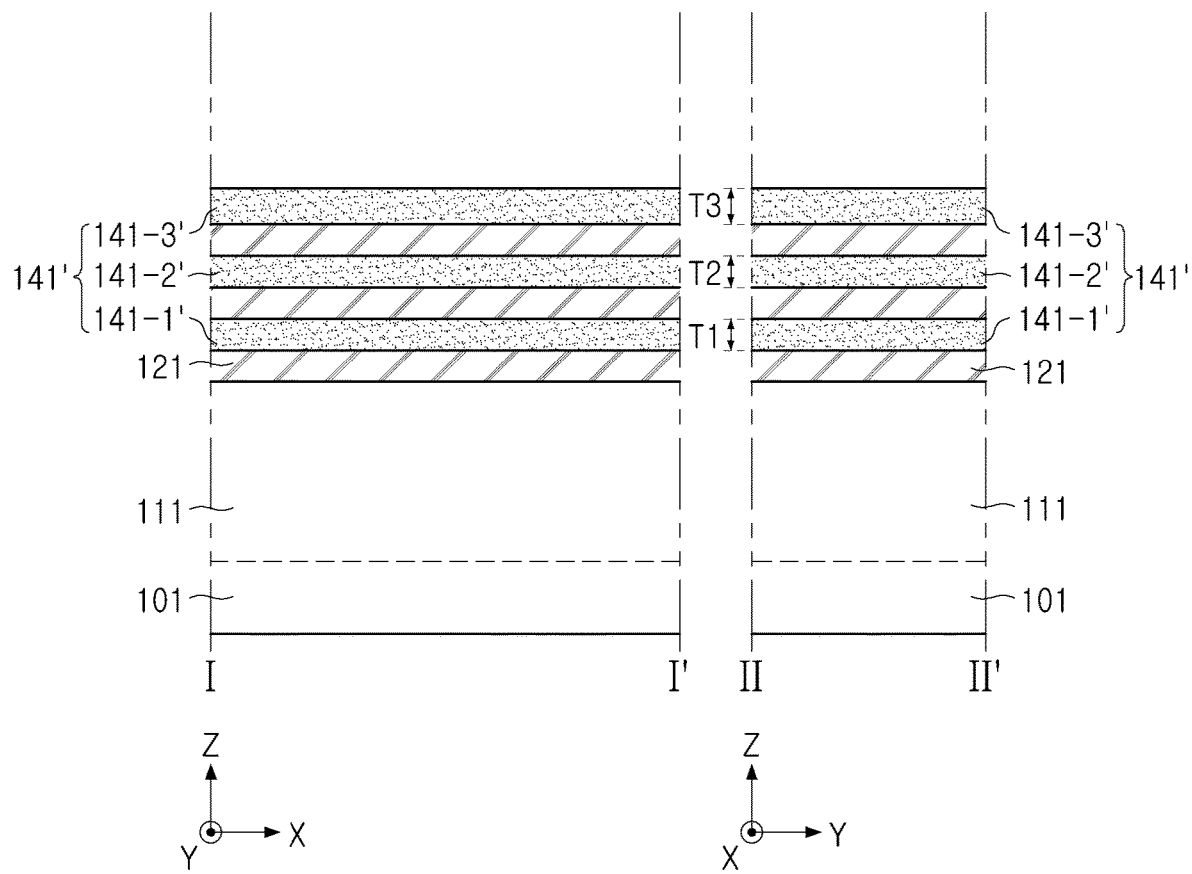
FIGS. 9A, 9B, 10A, 10B, 11A, 11B, 12A, 12B, 13A, 13B, 14A, 14B, 15A, 15B, 16A, 16B, 17A, and 17B are diagrams illustrating a sequential process of a method of manufacturing a semiconductor device according to an embodiment of the inventive concept.

Referring to FIG. 9A, sacrificial layers 121 and first semiconductor layers 141' may be alternately stacked on a substrate 101.

The sacrificial layers 121 may be replaced by the first gate dielectric layer 162 and the first gate electrode 163 as illustrated in FIG. 2A through a subsequent process. The sacrificial layers 121 may be formed of a material having etch selectivity with respect to the first semiconductor layers 141'. The first semiconductor layers 141' may include first lower semiconductor layers 141-1' and 141-2' and first uppermost semiconductor layer 141-3' disposed on the first lower semiconductor layers 141-1' and 141-2', and a thickness in the Z-direction of the first uppermost semiconductor layer 141-3' T3 may be greater than thicknesses in the Z-direction of the first lower semiconductor layers 141-1' and 141-2' T1 and T2, respectively. The thickness of the first uppermost semiconductor layer 141-3' T3 may range from, for example, about 70 Å to about 120 Å. The thickness of the first lower semiconductor layers 141-1' and 141-2' T1 and T2 may range from, for example, about 50 Å to about 100 Å. The first semiconductor layers 141' may include a material that is different from a material included in the sacrificial layers 121. The sacrificial layers 121 and the first semiconductor layers 141' may include, for example, a semiconductor material that includes at least one of silicon (Si), silicon germanium (SiGe), and germanium (Ge) but may include different materials. For example, the sacrificial layers 121 may include silicon germanium (SiGe), and the first semiconductor layers 141' may include silicon (Si).

In some embodiments, the number of layers of the first semiconductor layers 141' alternately stacked with the sacrificial layers 121 may be variously changed.

Figure 9B:
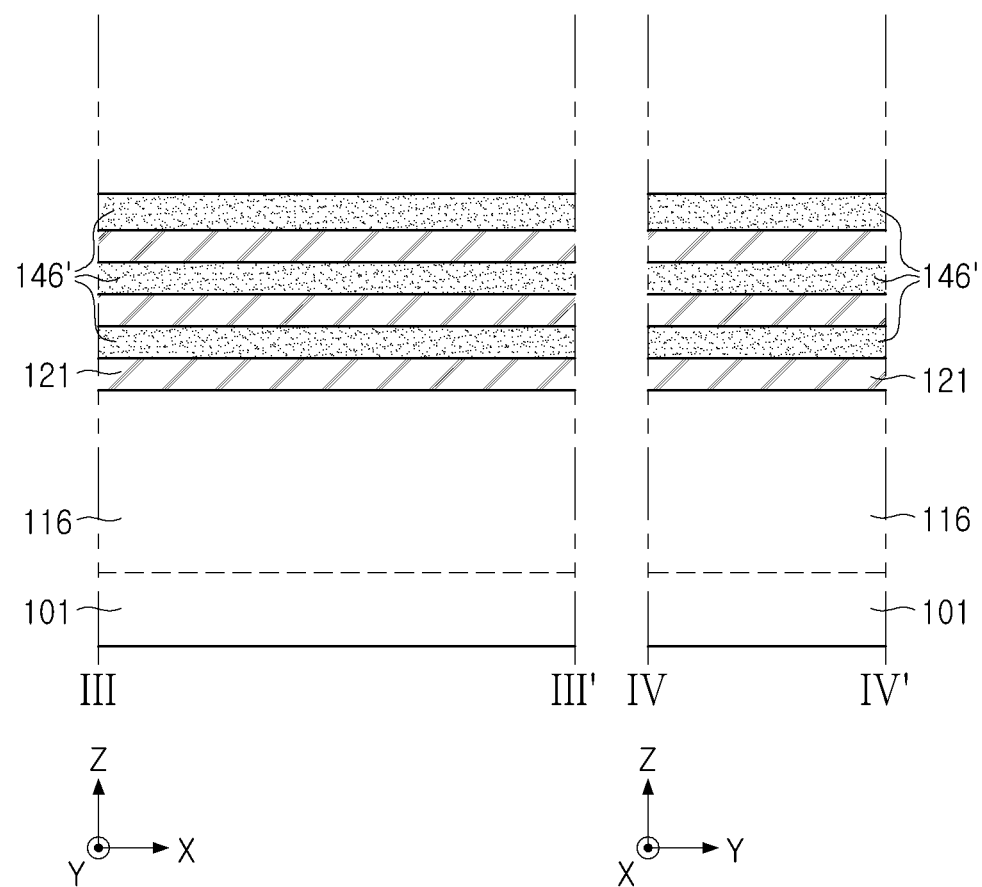

Referring to FIG. 9B, the sacrificial layers 121 and second semiconductor layers 146' may be alternately stacked on a substrate 101.

The sacrificial layers 121 may be layers formed during the same process as illustrated by FIG. 9A. The second semiconductor layers 146' may be formed during the same process as that of the first semiconductor layers 141' as illustrated by FIG. 9A. The sacrificial layers 121 and the second semiconductor layers 146' may be replaced with the second channel layer 146 through a subsequent process as illustrated in FIG. 2B.

Figure 10A:
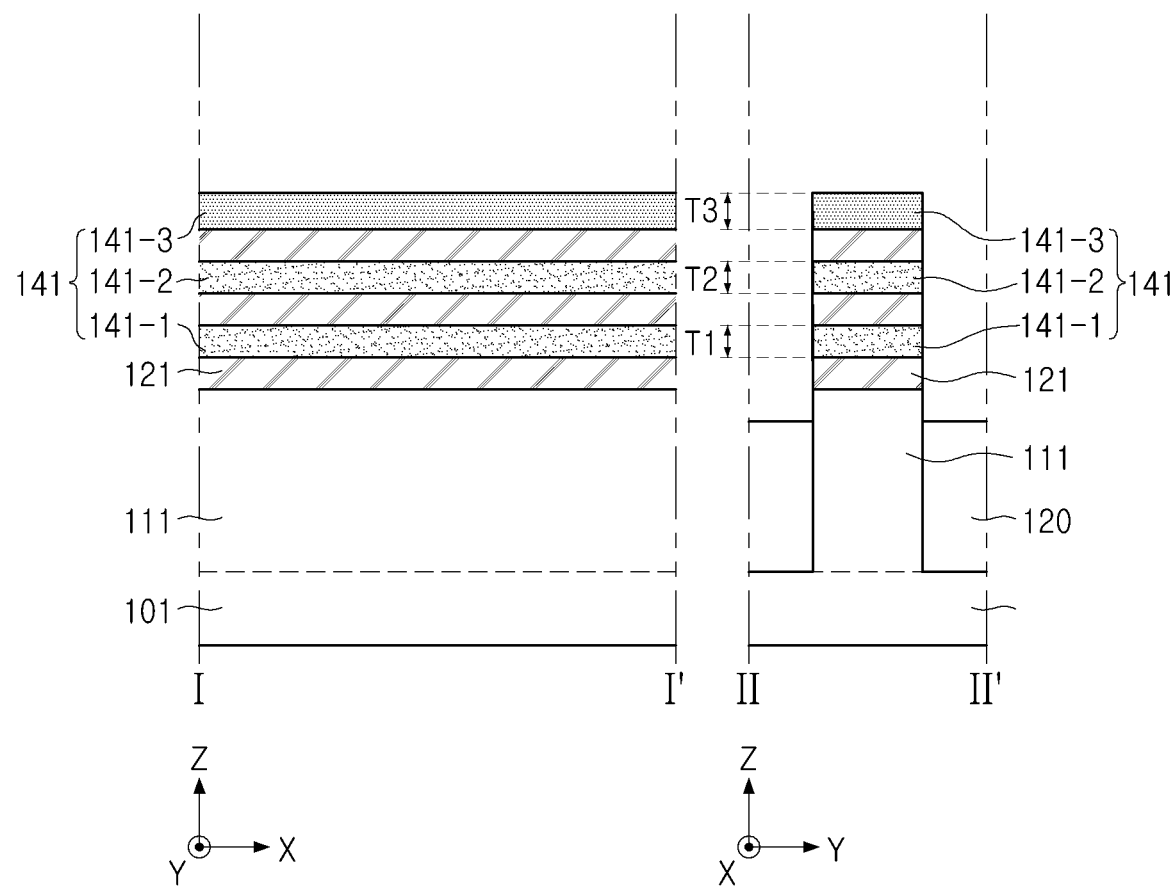

Referring to FIG. 10A, after ex-situ doping of carbon (C) into the first uppermost semiconductor layer 141-3', portions of the stack structure of the sacrificial layers 121, the first semiconductor layers 141', and the substrate 101 may be removed to form first and second active structures. The ex-situ doping may include plasma doping (PLAD) or a low energy ion implantation process. The carbon composition in the doped first uppermost semiconductor layer 141-3' may range from about 0.5% to about 3% by weight or by mass. In an embodiment, in contrast to the examples illustrated in FIGS. 9A and 10A, the sacrificial layers 121 and the first lower semiconductor layers 141-1' and 141-2' may be alternately stacked, and the first uppermost semiconductor layer 141-3' may be formed by in-situ carbon (C) doping while performing an epitaxy process on the sacrificial layer disposed at an uppermost portion among the sacrificial layers 121 using silicon (Si). The first active structures may then be formed by removing portions of the stack structure of the sacrificial layers 121, the first semiconductor layers 141-1', 141-2', and 141-3', and the substrate 101. The in-situ doping process may be performed, for example, under conditions within a range from about 450° C. to about 700° C. and within a range from about 10 torr to about 300 torr.

The first active structures may include sacrificial layers 121 and the plurality of first channel layers 141, where the sacrificial layers are alternately stacked with first channel layers of the plurality of first channel layers 141, and may further include a first active region 111 that protrudes from an upper surface of the substrate 101 as a portion of the substrate 101 is removed. The first active structures may be formed in a line shape extending in one direction, for example, the X-direction, and may be spaced apart from each other in the Y-direction.

The region from which the substrate 101 is partially removed is filled with an insulating material, and a portion of the insulating material may then be removed such that the first active region 111 protrudes, thereby forming device isolation layers 120. An upper surface of the device isolation layers 120 may be lower in the Z-direction than an upper surface of the first active region 111.

Figure 10B:
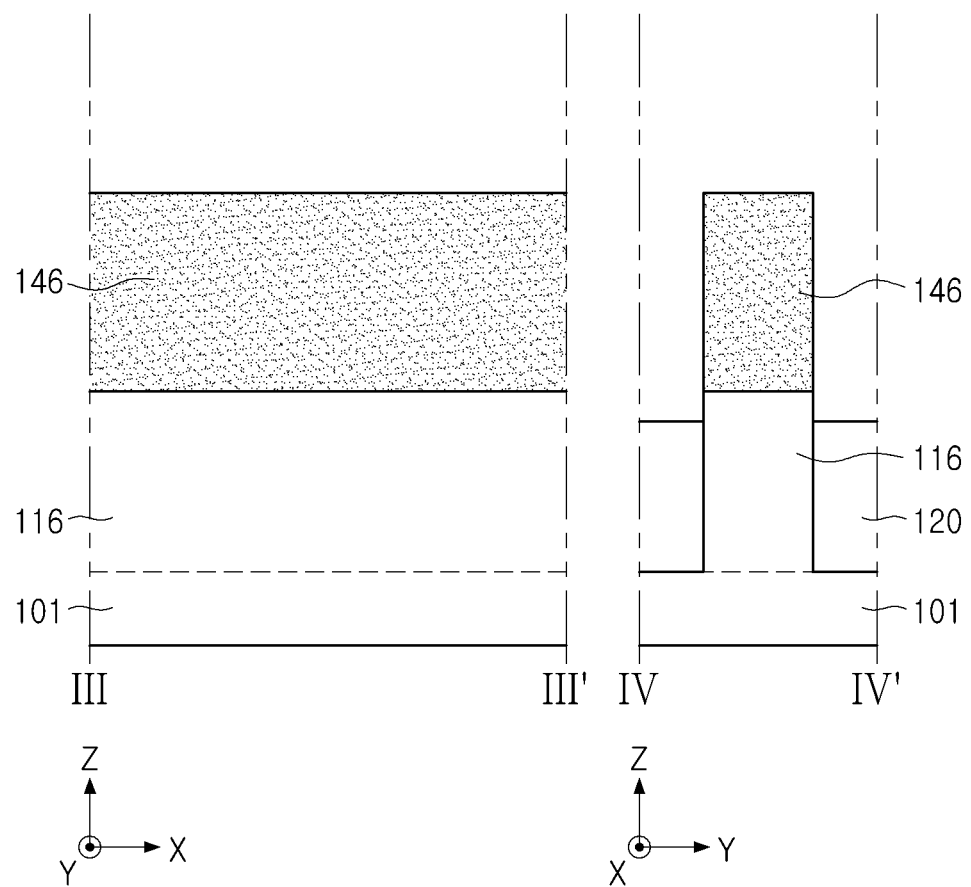

Referring to FIG. 10B, a recess portion may be formed by removing a portion of the sacrificial layers 121 and the second semiconductor layers 146'.

The recess portion may be formed in a line shape extending in one direction, for example, the X-direction, and may be spaced apart from each other in the Y-direction. The recess portion may be a portion of a second active structure formed through a subsequent process. The second channel layer 146 may be formed by performing an epitaxy process on the recess portion using a semiconductor material. The second channel layer 146 may include the same material as is included in the first lower channel layers 141-1 and 141-2.

The second active structures may be formed by removing portions of the sacrificial layers 121 adjacent to the second channel layer 146, the second semiconductor layers 146', and the substrate 101.

The second active structure may include a second channel layer 146 and may further include a second active region 116 that protrudes from the upper surface of the substrate 101 by removing a portion of the substrate 101. The second active structures may be formed in a line shape extending in one direction, for example, the X-direction, and may be spaced apart from each other in the Y-direction. A region from which the substrate 101 is partially removed may be filled with an insulating material, and the insulating material may then be partially removed such that the second active region 116 protrudes, thereby forming the device isolation layers 120. An upper surface of the device isolation layers 120 may be lower in the Z-direction than an upper surface of the second active region 116.

In some embodiments, the upper surface of the first uppermost channel layer 141-3 and the upper surface of the second channel layer 146 may be disposed at substantially the same height in the Z-direction. In some embodiments, the upper surface of the first uppermost channel layer 141-3 and the upper surface of the second channel layer 146 may be disposed at different heights in the Z-direction.

Figure 11B:
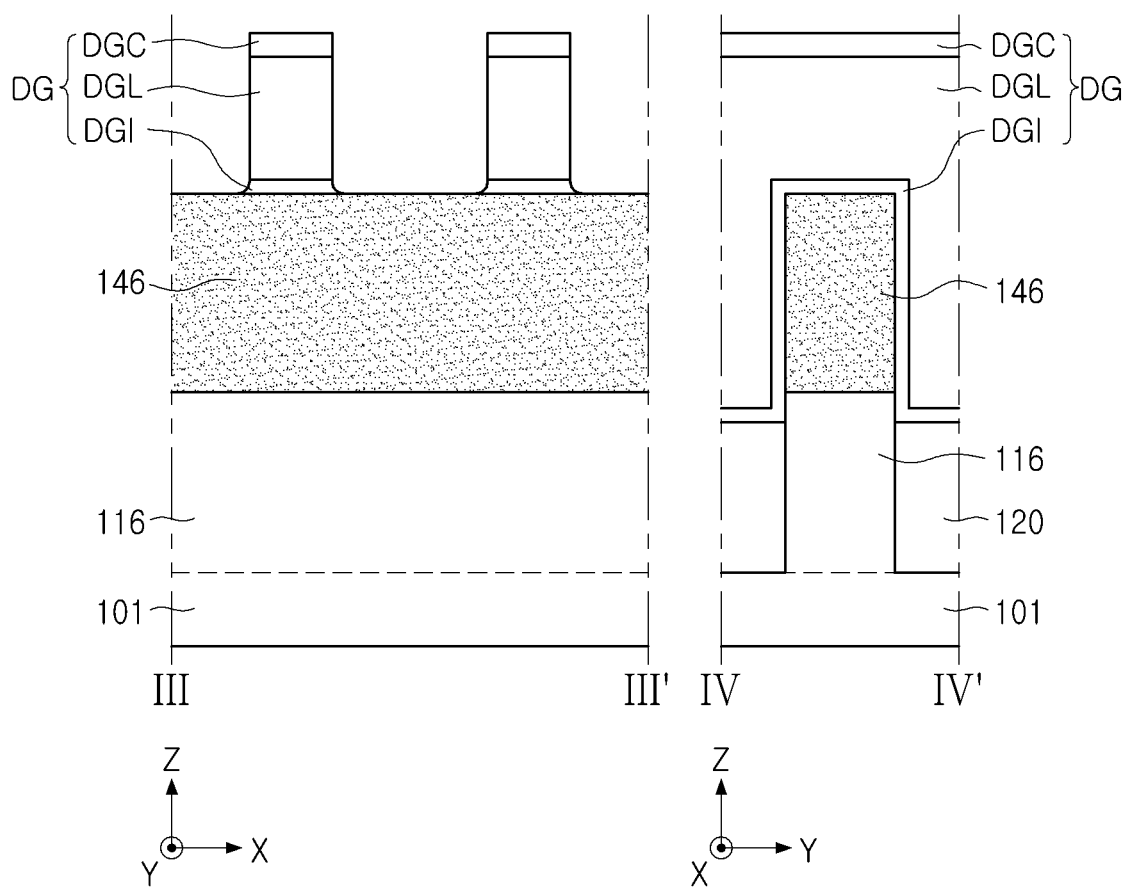

Referring to FIGS. 11A and 11B, sacrificial gate structures DG may be formed on the first and second active structures.

The sacrificial gate structures DG may be sacrificial structures formed in a region in which the first gate dielectric layer 162 and the first gate electrode 163 are disposed above the plurality of first channel layers 141 through a subsequent process (as shown in FIG. 2A) and/or may be sacrificial structures formed in a region in which the second gate dielectric layer 167 and the second gate electrode 168 are disposed above the second channel layer 146 through a subsequent process (as shown in FIG. 2B).

The sacrificial gate structures DG may include a sacrificial gate insulating layer DGI, a sacrificial gate layer DGL, and a sacrificial gate capping layer DGC, where the sacrificial gate insulating layer DGI, the sacrificial gate layer DGL, and the sacrificial gate capping layer DGC are sequentially stacked.

The sacrificial gate layer DGL may be formed of, for example, polysilicon, and the sacrificial gate capping layer DGC may include a silicon nitride layer. The sacrificial gate insulating layer DGI may be formed of a material having an etch selectivity with respect to the sacrificial gate layer DGL may such as at least one of thermal oxide, silicon oxide, and silicon nitride.

The sacrificial gate insulating layer DGI may include a protrusion that protrudes outside the sidewalls of the dummy gate structures DG. For example, a width of a portion of the sacrificial gate layer insulating layer DGI in the X-direction may be wider than a width of the remaining dummy gate structures DG in the X-direction. Accordingly, a sidewall of the sacrificial gate insulating layer DGI may include a region that does not overlap sidewalls of the sacrificial gate layer DGL and the sacrificial gate capping layer DGC. Referring to FIGS. 11A and 11B, in some embodiments, the protrusion of the sacrificial gate insulating layer DGI is illustrated such that a width of the sacrificial gate insulating layer DGI increases from the sacrificial gate layer DGL toward the first uppermost channel layer 141-3 and the second channel layer 146. In some embodiments, the shape of the protrusion of the sacrificial gate layer DGI may be variously changed.

Referring to FIG. 12A, an etching process may be performed to remove the protrusion of the sacrificial gate insulating layer DGI. By removing the protrusion of the sacrificial gate insulating layer DGI, manufacturing process defects such as an unwanted connection between the first source/drain region 151 and the dummy gate layer DGL may be mitigated.

As illustrated in FIG. 12A, the sidewall of the sacrificial gate insulating layer DGI is formed to not be recessed inward from the side wall of the sacrificial gate layer DGL, so that the first spacer structures 171 formed in a subsequent process may be omitted between the first gate structure 161 and the first uppermost channel layer 141-3. For example, the sidewall of the sacrificial gate insulating layer DGI may be formed to be substantially coplanar with the sidewall of the sacrificial gate layer DGL during an etching process.

A portion of the first uppermost channel layer 141-3 may be removed during the etching process of the sacrificial gate insulating layer DGI.

A portion of the first uppermost channel layer 141-3 may be removed in a region in which the first uppermost channel layer 141-3 does not overlap the sacrificial gate structures DG, so that a thickness in the Z-direction of a portion of the first uppermost channel layer 141-3 may be reduced. Accordingly, the first difference t1 may be made between the thickness of the portion of the first uppermost channel layer 141-3 overlapping the sacrificial gate structures DG and the thickness of the remaining portion of the first uppermost channel layer 141-3. The portion of the first uppermost channel layer 141-3 overlapping the sacrificial gate structures DG may refer to a first central region CA1 (see FIG. 3A) of the first uppermost channel layer 141-3.

Figure 12B:
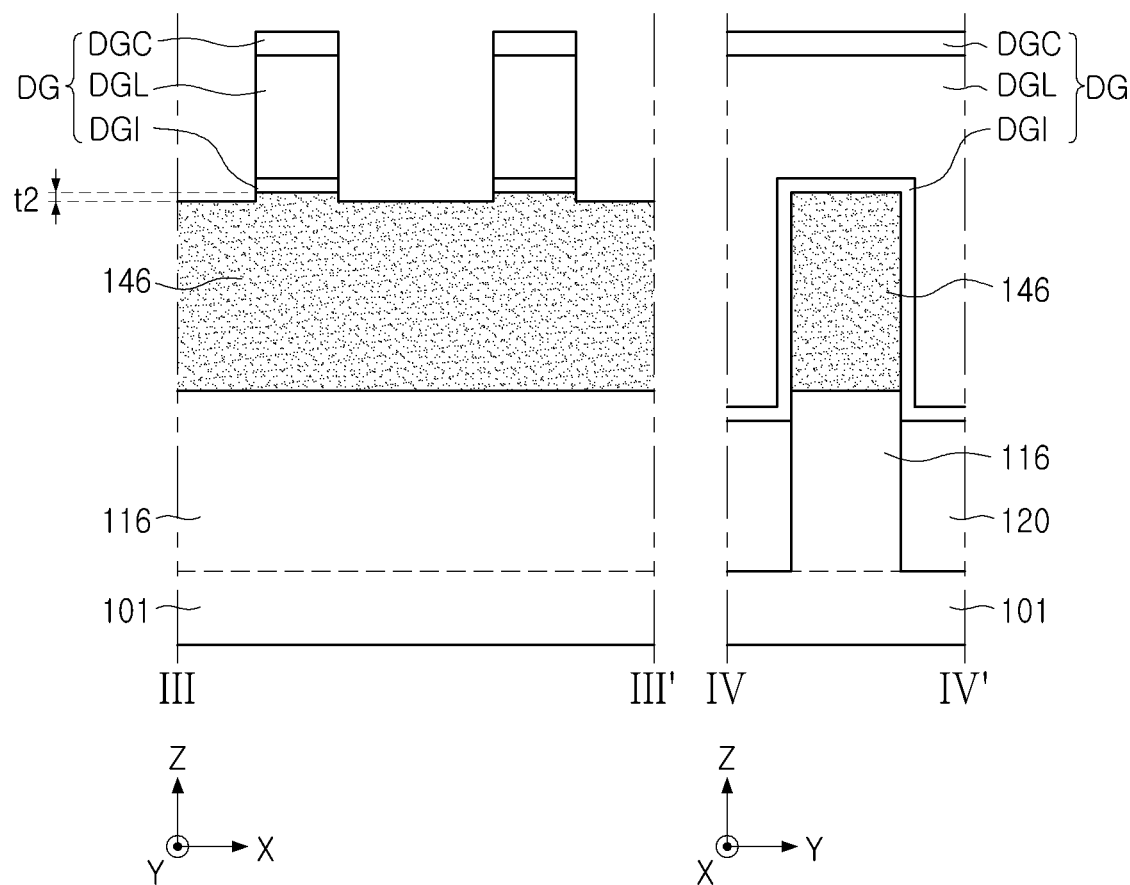

Referring to FIG. 12B, an etching process for removing the protrusion of the sacrificial gate insulating layer DGI may be performed in the same manner as the example described above with reference to FIG. 12A. A portion of the second channel layer 146 may be removed during the etching process of the sacrificial gate insulating layer DGI.

A portion of the second channel layer 146 is removed in a region that does not overlap the sacrificial gate structures DG, so that, as illustrated in FIG. 12B, a thickness in the Z-direction of a portion of the second channel layer 146 may be reduced. Accordingly, in the second channel layer 146, the second difference t2 may be made between a thickness of the portion of the second channel layer 146 overlapping the sacrificial gate structures DG and the thickness of the remaining portion of the second channel layer 146. The portion of the second channel layer 146 overlapping the sacrificial gate structures DG may refer to a second central region CA2 (see FIG. 3B) of the second channel layer 146 formed through a subsequent process.

The first difference t1 of the first uppermost channel layer 141-3 may be less than the second difference t2 of the second channel layer 146. Since the first uppermost channel layer 141-3 includes a material having a stronger etch resistance than a material included in the second channel layer 146, the thickness of the first uppermost channel layer 141-3 may be less reduced during the etching process.

Figure 13A:
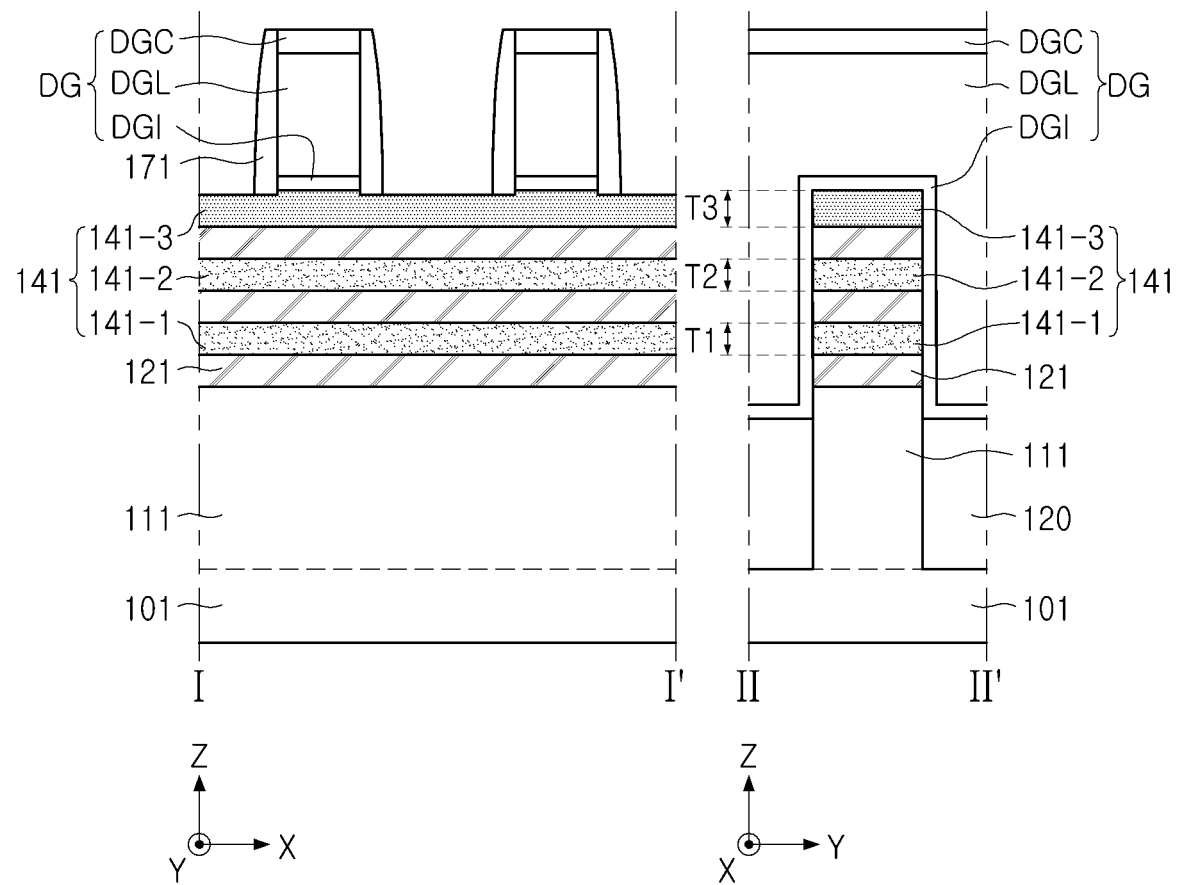
Figure 13B:
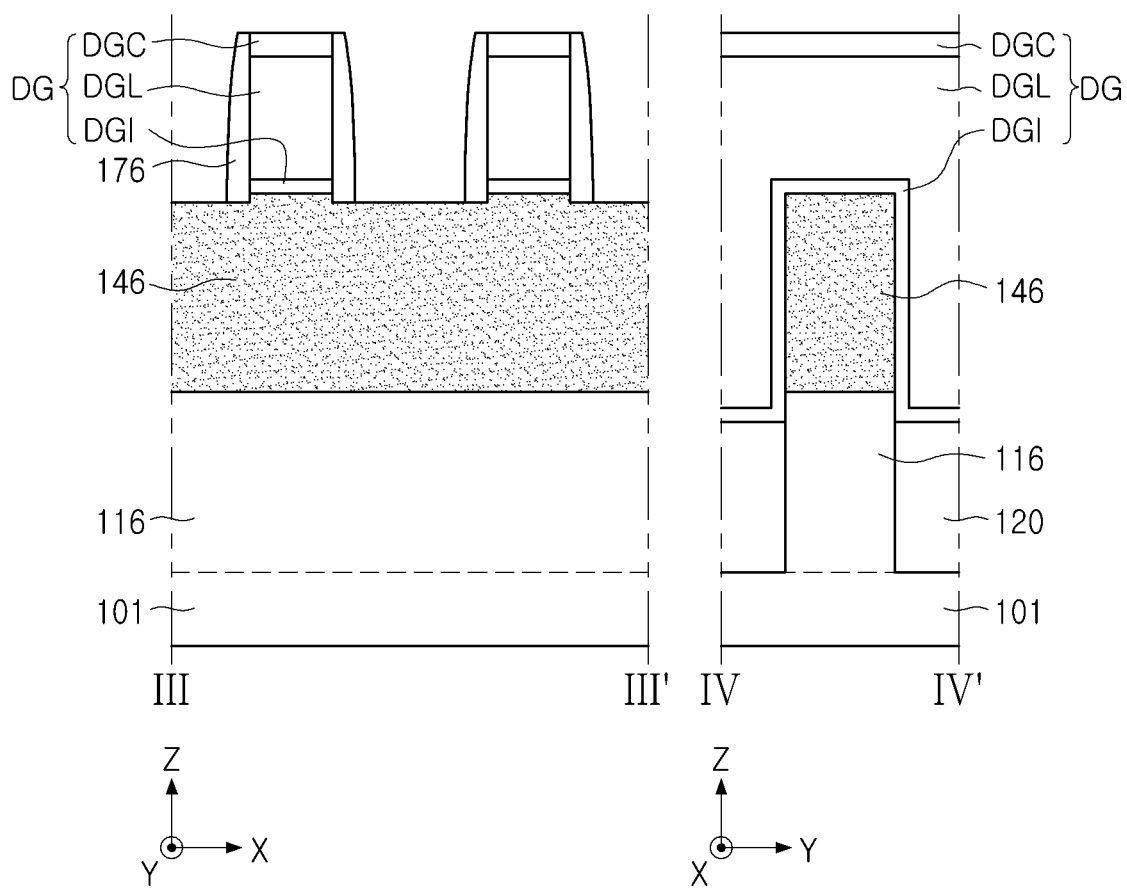

Referring to FIGS. 13A and 13B, first and second spacer structures 171 and 176 may be formed on both sidewalls of the sacrificial gate structures DG. Lower surfaces of the first and second spacer structures 171 and 176 may be disposed at a lower height in the Z-direction than lower surfaces of the sacrificial gate insulating layer DGI. The first and second spacer structures 171 and 176 may contact side surfaces of the sacrificial gate insulating layer DGI.

A film having a uniform thickness may be formed along the upper and side surfaces of the sacrificial gate structures DG and the first and second active structures. The first and second spacer structures 171 and 176 may be formed by performing anisotropic etching on the film. The first and second spacer structures 171 and 176 may include, for example, at least one of SiO, SiN, SiCN, SiOC, SiON, and SiOCN.

The first spacer structures 171 may be disposed on both sides (e.g., opposing sides) in the X-direction of the first central region CA1 (see FIG. 3A) of the first uppermost channel layer 141-3. The second spacer structures 176 may be disposed on both sides (e.g., opposing sides) in the X-direction of the second central region CA2 (see FIG. 3B) of the second channel layer 146.

Figure 14A:
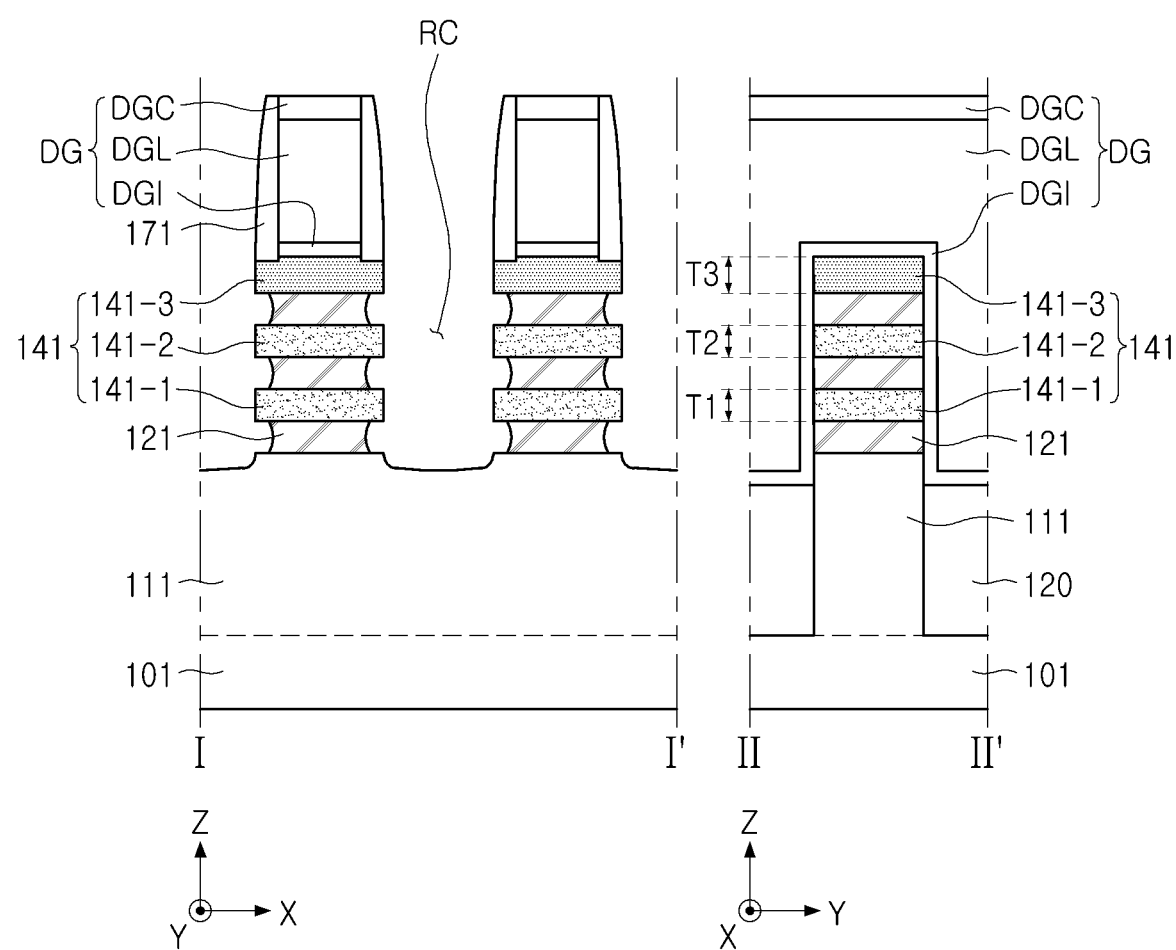
Figure 14B:
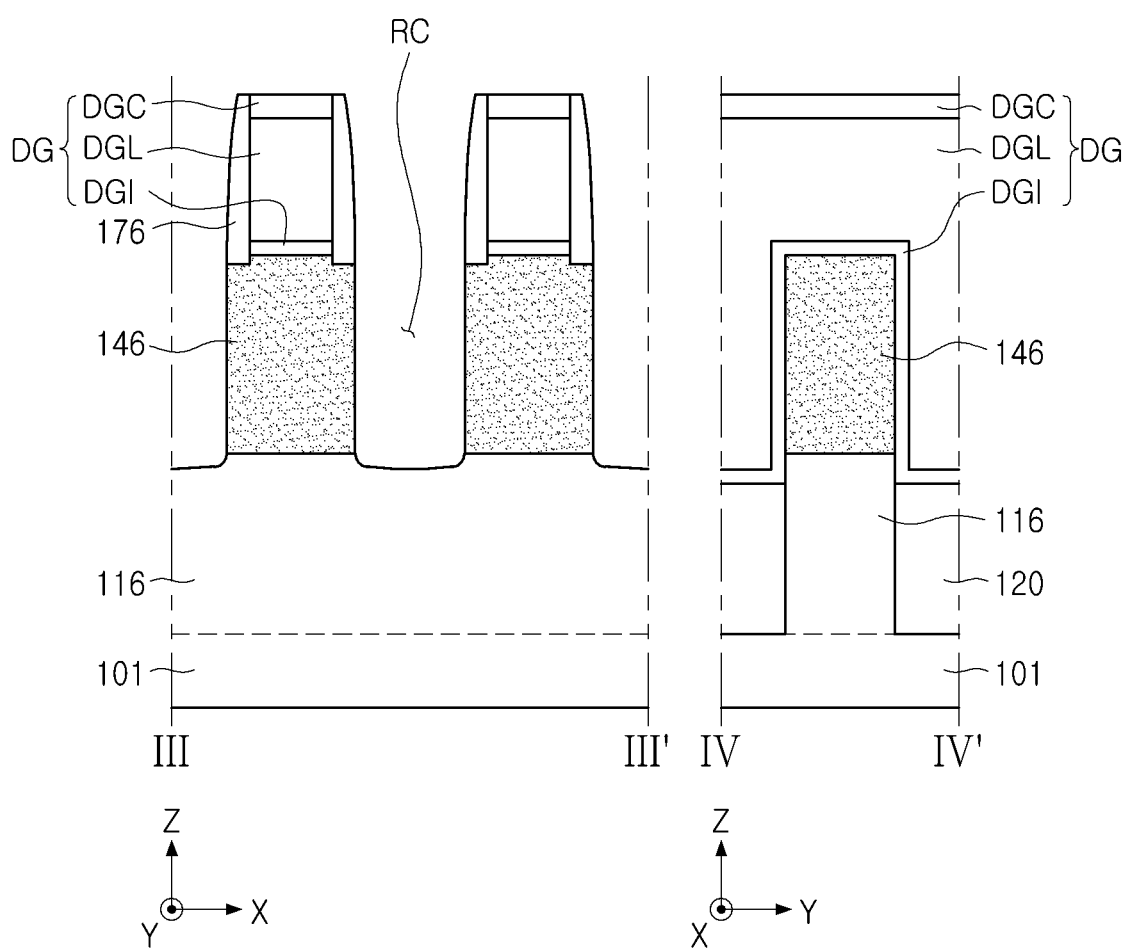

Referring to FIGS. 14A and 14B, the sacrificial layers 121, the plurality of first channel layers 141, and the second channel layer 146 exposed between the sacrificial gate structures DG may be removed to form the recess portion RC. The exposed sacrificial layers 121, the plurality of first channel layers 141, and the second channel layer 146 may be removed using the sacrificial gate structures DG and the spacer structures 170 as masks. In some embodiments, the recess portion RC may extend into the substrate 101 so that a portion of the substrate 101 is recessed.

Referring to FIG. 14A, the recess portion RC may expose a side surface extending in the Y-direction of the sacrificial layers 121, and a portion of the sacrificial layers 121 adjacent to the side surface may be further removed through a selective etching process (i.e., a process in which the plurality of first channel layers 141 are not etched) such as wet etching. Accordingly, the sacrificial layers 121 may include side surfaces that are concavely rounded inward toward each other. In some embodiments, the lateral shape in the X-direction (e.g., the shape of a side surface extending in the Y-direction) of the sacrificial layers 121 may be variously changed. In an embodiment, both a portion of the sacrificial layers 121 and a portion of the plurality of first channel layers 141 may be removed by an etching process so that sidewalls of both the sacrificial layers 121 and the plurality of first channel layers 141 are concavely rounded inward in the X-direction.

Figure 15A:
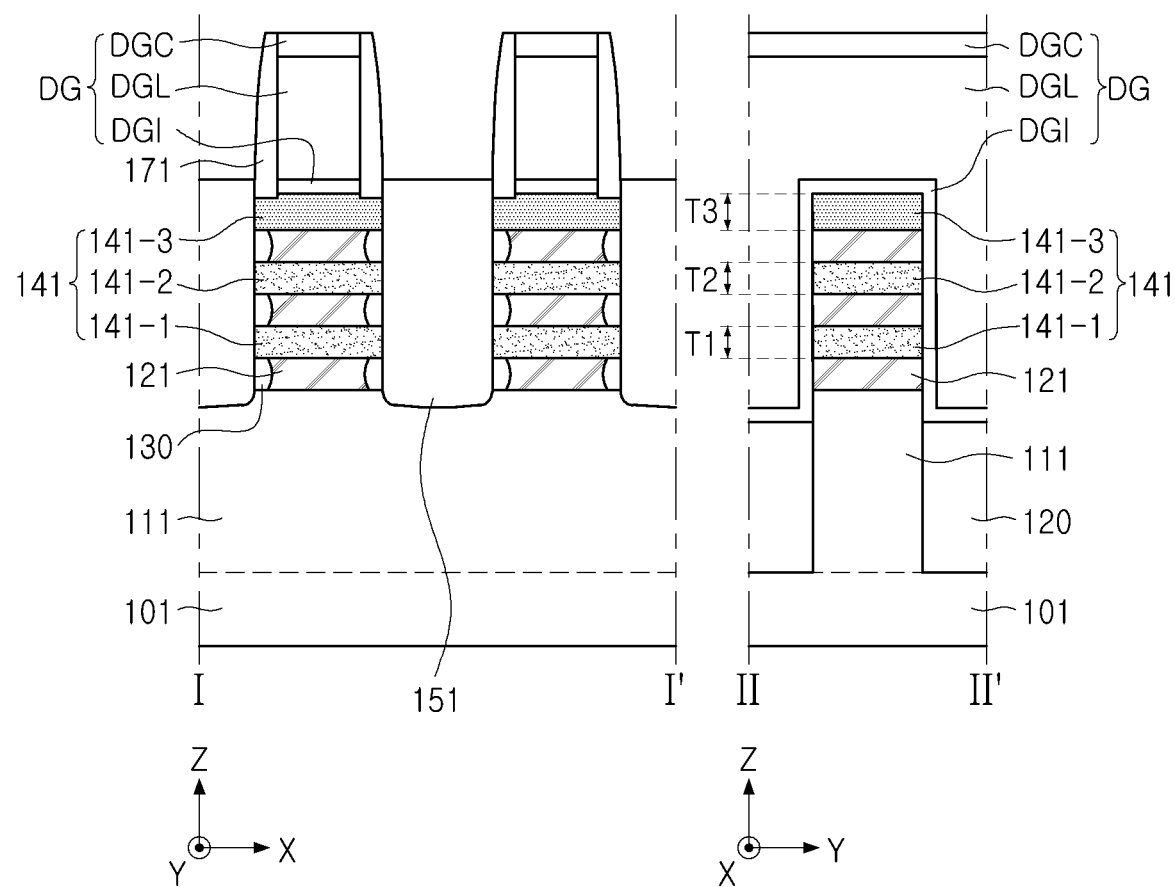

Referring to FIG. 15A, inner spacer layers 130 may be formed in the recesses that are formed when portions of the sacrificial layers 121 are removed. For example, the inner spacer layers 130 may be formed by filling the recesses that are formed by removing portions of the sacrificial layers 121 with an insulating material and removing insulating material deposited on the outside of the plurality of first channel layers 141. In some embodiments, the inner spacer layers 130 may be formed of a same material as is included in the spacer structures 170. In some embodiments, the inner spacer layers 130 may be formed of a different material as is included in the spacer structures 170. For example, the inner spacer layers 130 may include at least one of SiN, SiCN, SiOCN, SiBCN, and SiBN. In some embodiments, the removal of portions of the sacrificial layers 121 and the inner spacer layers 130 may be omitted.

Figure 15B:
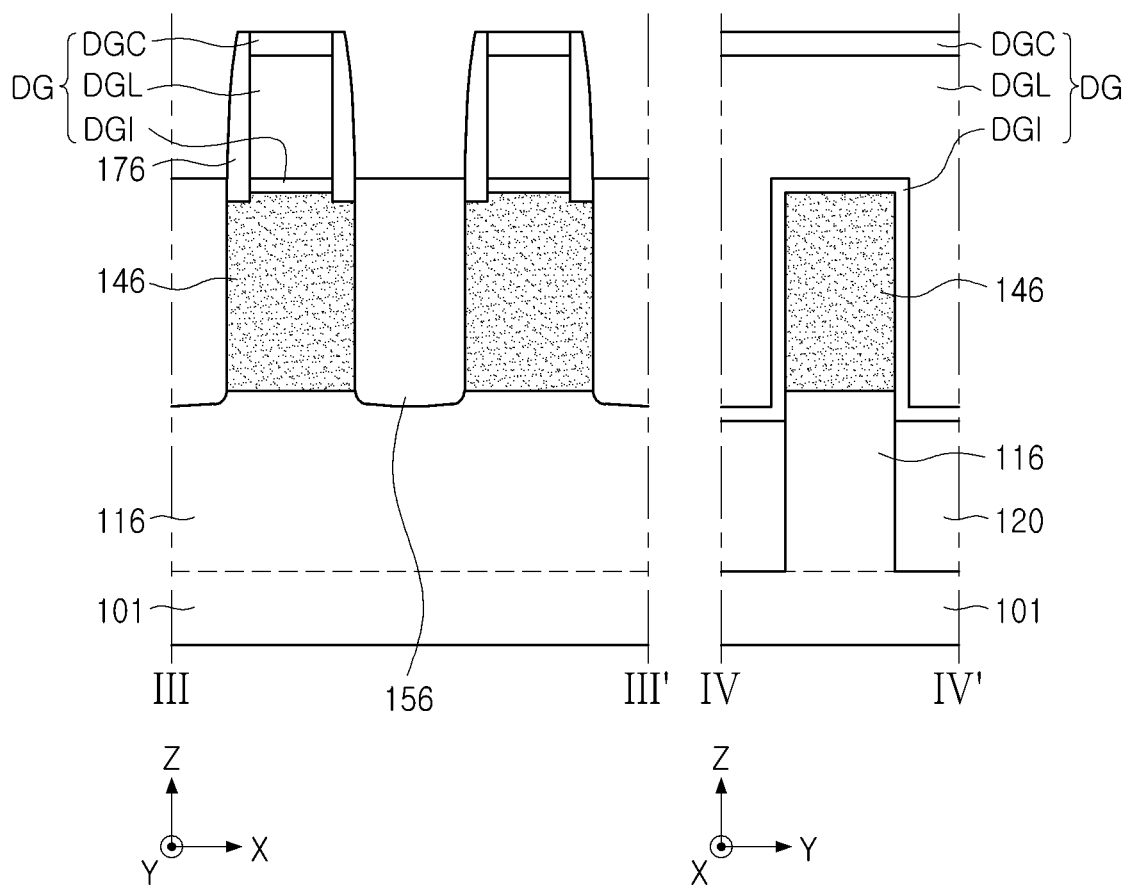

Next, referring to FIGS. 15A and 15B, first and second source/drain regions 151 and 156 may be respectively formed on the first and second active regions 111 and 116 on both sides (e.g., opposing sides) of the sacrificial gate structures DG in the X-direction. The source/drain regions 150 may be formed by performing an epitaxial growth process in the recess portion RC. The source/drain regions 150 may include impurities provided by in-situ doping and may include a plurality of layers that include different doping elements and/or doping concentrations.

Figure 16A:
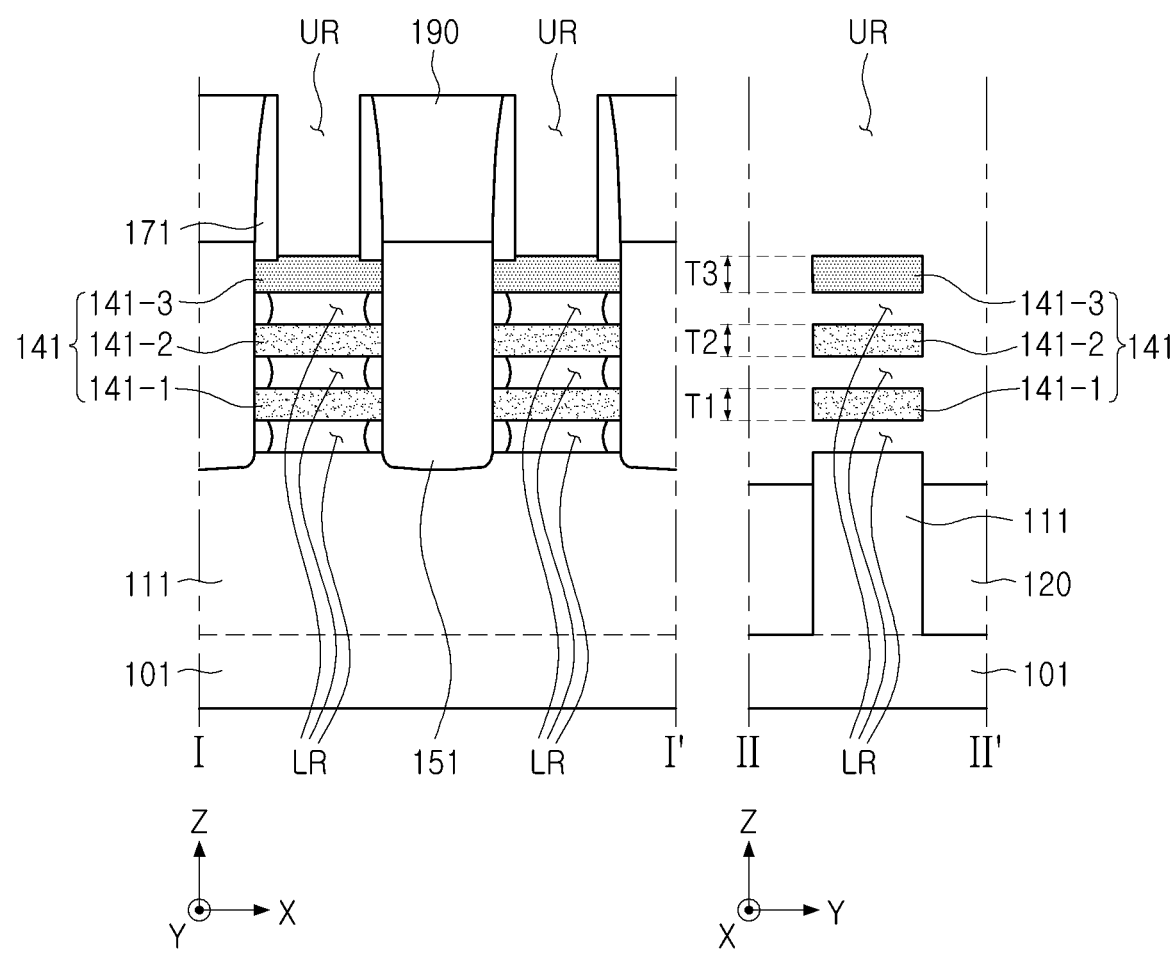
Figure 16B:
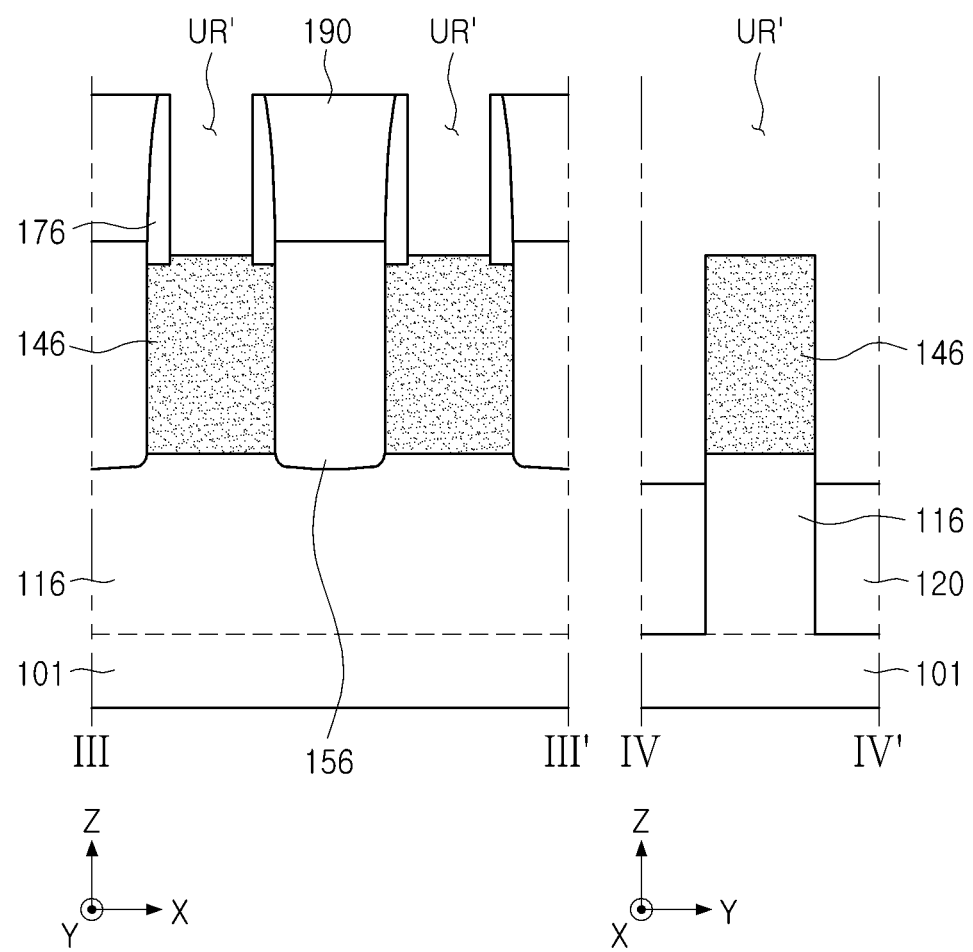

Referring to FIGS. 16A and 16B, the interlayer insulating layer 190 may be formed and the sacrificial layers 121 and the sacrificial gate structures DG may be removed. An insulating layer covering the sacrificial gate structures DG and the source/drain regions 150 may be formed, and the interlayer insulating layer 190 may be formed by performing a planarization process on the insulating layer. The sacrificial layers 121 and the sacrificial gate structures DG may be selectively removed (e.g., without removing the spacer structures 170, the interlayer insulating layer 190, the plurality of first channel layers 141, and the second channel layer 146). First, the sacrificial gate structures DG may be removed to form upper gap regions UR and UR', and then, as illustrated in FIG. 16A, the sacrificial layers 121 exposed through the upper gap regions UR may be removed to form lower gap regions LR. For example, when the sacrificial layers 121 include silicon germanium (SiGe) and the plurality of first channel layers 141 include silicon (Si), the sacrificial layers 121 may be selectively removed by performing a wet etching process using peracetic acid as an etchant.

Figure 17A:
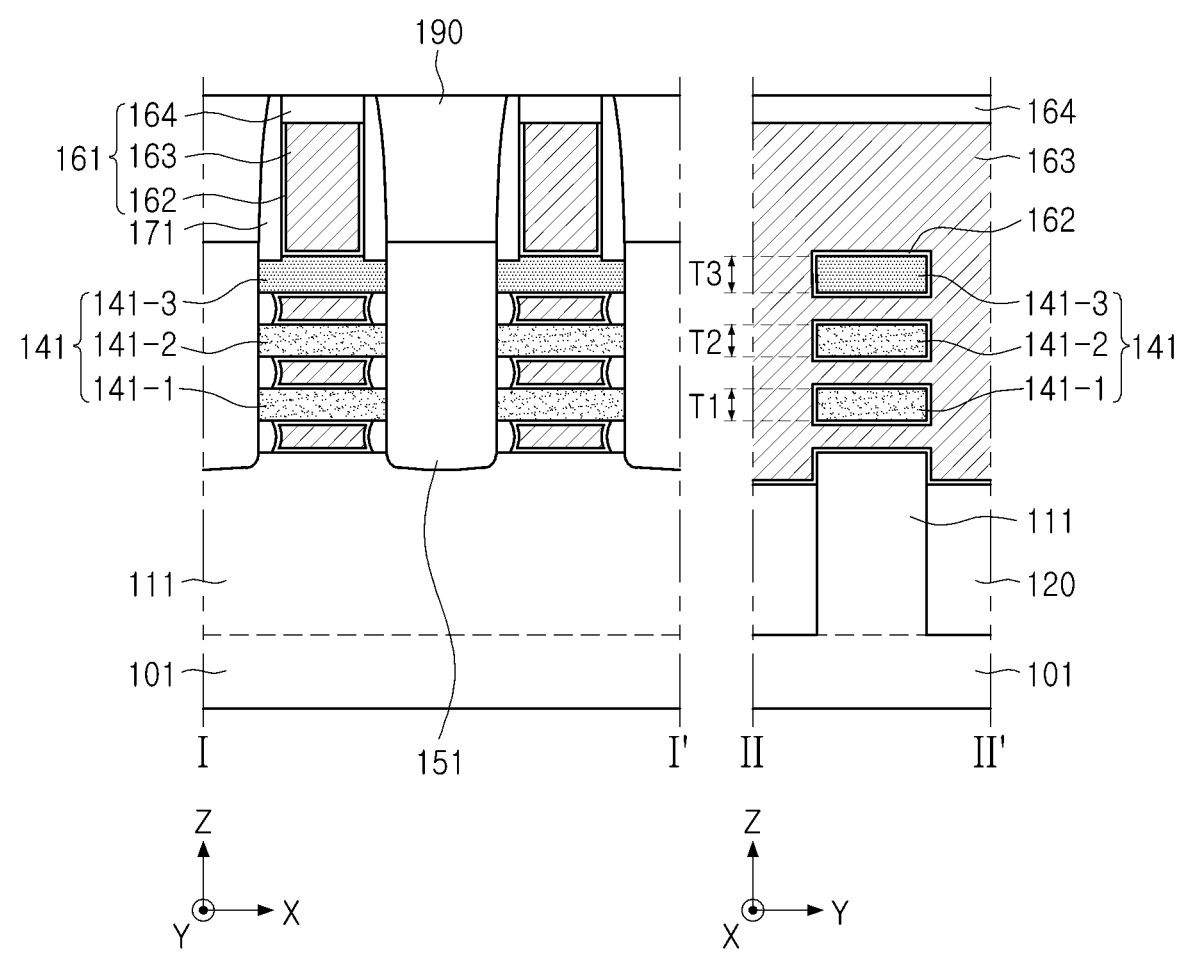
Figure 17B:
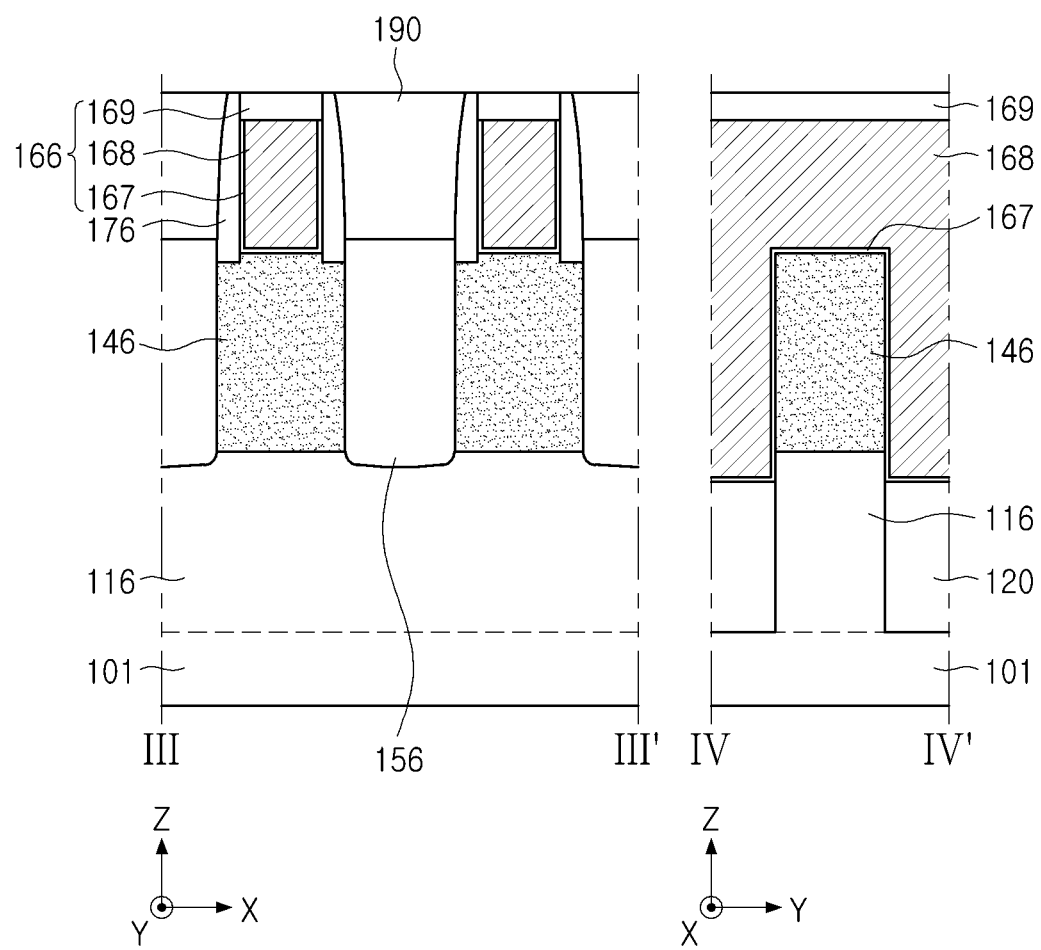

Referring to FIGS. 17A and 17B, a first gate structure 161 and a second gate structure 166 may be formed in the upper gap regions UR and UR' and the lower gap regions LR.

Referring to FIG. 17A, the first gate dielectric layer 162 may be formed so that it conformally covers inner surfaces of the upper gap regions UR and the lower gap regions LR. After the first gate electrode 163 is formed so that it completely fills the upper gap regions UR and the lower gap regions LR, the first gate electrode 163 may be removed from an upper portion to a predetermined depth in the Z-direction in the upper gap regions UR. A first gate capping layer 164 may be formed in a region in which the first gate electrode 163 is removed from the upper gap regions UR.

Referring to FIG. 17B, the second gate dielectric layer 167 may be formed so that it conformally covers the upper gap regions UR'. After the second gate electrode 168 is formed so that it completely fills the upper gap regions UR', the second gate electrode 168 may be removed from an upper portion to a predetermined depth in the Z-direction in the upper gap regions UR'. A second gate capping layer 169 may be formed in a region in which the second gate electrode 168 is removed from the upper gap regions UR'.

Accordingly, the first gate structure 161 and the second gate structure 166 that respectively include first and second gate dielectric layers 162 and 167, first and second gate electrodes 163 and 168, and first and second gate capping layers 164 and 169 may be formed.

Next, referring to FIGS. 2A and 2B together, first and second contact plugs 181 and 186 may be formed. First, the interlayer insulating layer 190 may be patterned to form a contact hole, and the contact hole may be filled with a conductive material to form the first and second contact plugs 181 and 186. A lower surface of the contact hole in the Z-direction may be recessed into the source/drain regions 150 or may include a curve along upper surfaces in the Z-direction of the source/drain regions 150. In some embodiments, a shape and arrangement of the first and second contact plugs 181 and 186 may be variously changed.

As described above, a semiconductor device having reduced channel layer loss by including a material in an uppermost channel layer different from a material included in a lower channel layer to strengthen an etch resistance of the uppermost channel layer may be provided.

While the inventive concept has been particularly illustrated and described with reference to embodiments thereof, it will be understood by one of ordinary skill in the art that variations in form and detail may be made therein without departing from the scope of the present disclosure.

What is claimed is:

1. A semiconductor device comprising:
    a substrate;
    active regions disposed on the substrate, the active regions including:
        a first active region extending on the substrate in a horizontal direction parallel to an upper surface of the substrate, and
        a second active region spaced apart from the first active region;
    a plurality of channel layers disposed on the active regions, the plurality of channel layers including:
        a plurality of first channel layers disposed on the first active region, wherein first channel layers of the plurality of first channel layers are spaced apart from each other in a vertical direction perpendicular to the upper surface of the substrate, and
        a second channel layer disposed on the second active region;
    gate structures disposed on the substrate, the gate structures including:
        a first gate structure intersecting the first active region and the first channel layers, and
        a second gate structure intersecting the second active region and the second channel layer; and
    source/drain regions disposed on the active regions, the source/drain regions including:
        a first source/drain region disposed on the first active region on at least one side of the first gate structure and contacting the plurality of first channel layers, and
        a second source/drain region disposed on the second active region on at least one side of the second gate structure and contacting the second channel layer,
    wherein the plurality of first channel layers includes a first uppermost channel layer and first lower channel layers disposed below the first uppermost channel layer, and
    the first uppermost channel layer includes a material that is different from a material included in the first lower channel layers.

2. The semiconductor device of claim 1, wherein the first lower channel layers and the second channel layer include silicon (Si), and the first uppermost channel layer includes silicon carbide.

3. The semiconductor device of claim 2, wherein a composition of carbon (C) in the first uppermost channel layer ranges from about 0.5% to about 3% by weight or by mass.

4. The semiconductor device of claim 1, wherein the second channel layer has a thickness greater than a sum of thicknesses of the first channel layers.

5. The semiconductor device of claim 4, wherein an uppermost surface of the first uppermost channel layer and an uppermost surface of the second channel layer are disposed at a substantially similar height.

6. The semiconductor device of claim 1, wherein:
    the first uppermost channel layer includes:
        a first central region vertically overlapping the first gate structure, and
        first peripheral regions disposed on opposing sides of the first central region; and
    a first thickness of the first uppermost channel layer in the first central region is greater than a second thickness of the first uppermost channel layer in the first peripheral regions.

7. The semiconductor device of claim 6, wherein the first thickness ranges from about 70 Å to about 120 Å, and the second thickness ranges from about 50 Å to about 100 Å.

8. The semiconductor device of claim 6, further comprising first spacer structures disposed on opposing sidewalls of the first gate structure, wherein the first peripheral regions vertically overlap the first spacer structures.

9. The semiconductor device of claim 8, wherein an upper surface of the first central region contacts the first gate structure, and upper surfaces of the first peripheral regions contact the first spacer structures.

10. The semiconductor device of claim 6, wherein:
    the second channel layer includes:
        a second central region vertically overlapping the second gate structure, and
        second peripheral regions disposed on opposing sides of the second central region; and
    a third thickness of the second channel layer in the first central region is greater than a fourth thickness of the second channel layer in the second peripheral regions.

11. The semiconductor device of claim 10, wherein a difference between the first thickness and the second thickness is smaller than a difference between the third thickness and the fourth thickness.

12. The semiconductor device of claim 1, wherein:
    the first gate structure includes an inclined sidewall inclined at an obtuse angle from a bottom portion of the first gate structure, and a width of the inclined sidewall at a lower end of the inclined sidewall is less than a width of the inclined sidewall at an upper end of the inclined sidewall;
    the first uppermost channel layer includes:
        a first central region contacting the first gate structure, and
        first peripheral regions disposed on opposing sides of the first central region; and
    a first thickness in the first central region is greater than a second thickness in the second peripheral regions.

13. The semiconductor device of claim 1, wherein:
    the first uppermost channel layer includes:
        a first central region vertically overlapping the first gate structure, and first peripheral regions disposed on both sides of the first central region;
a first thickness of the first uppermost channel layer in the first central region and a second thickness of the first uppermost channel layer in the first peripheral regions are substantially equal; and
the first thickness is greater than a thickness of each of the first lower channel layers.

14. The semiconductor device of claim 1, wherein the first lower channel layers include silicon (Si), and the first uppermost channel layer and the second channel layer include silicon carbide.

15. A semiconductor device comprising:
a substrate;
a first transistor disposed on the substrate, the first transistor including:
 a first active region extending on the substrate in a first horizontal direction parallel to an upper surface of the substrate,
 a plurality of first channel layers disposed on the first active region, wherein first channel layers of the plurality of first channel layers are spaced apart from each other, the first channel layers including a first uppermost channel layer and first lower channel layers,
 a first gate structure intersecting the first active region and the plurality of first channel layers, and extending in a second horizontal direction, and
 a first source/drain region disposed on the first active region on at least one side of the first gate structure and contacting the plurality of first channel layers; and
a second transistor disposed on the substrate, the second transistor including:
 a second active region spaced apart from the first active region,
 a second channel layer disposed on the second active region,
 a second gate structure intersecting the second active region and the second channel layer, and extending in a vertical direction perpendicular to the upper surface of the substrate, and
 a second source/drain region disposed on the second active region on at least one side of the second gate structure and contacting the second channel layer,
wherein a threshold voltage of the first transistor is lower than a threshold voltage of the second transistor,
wherein the first uppermost channel layer is thicker than each of the first lower channel layers,
wherein the second channel layer has a thickness greater than a sum of thicknesses of the first channel layers of the plurality of first channel layers, and
wherein the second channel layer includes a material that is different from a material included in the first uppermost channel layer.

16. The semiconductor device of claim 15, wherein the first lower channel layers and the second channel layer include silicon (Si), and the first uppermost channel layer includes silicon carbide.

17. The semiconductor device of claim 15, wherein the plurality of first channel layers include silicon (Si), and the second channel layer includes silicon carbide.

18. The semiconductor device of claim 15, wherein the first uppermost channel layer includes:
a silicon layer having a thickness substantially equal to a thickness of each of the first lower channel layers, and
a silicon carbide layer disposed on the silicon layer.

19. A semiconductor device comprising:
a substrate;
an active region disposed on the substrate and extending on the substrate in a first horizontal direction parallel to an upper surface of the substrate;
a plurality of channel layers disposed on the active region, the plurality of channel layers including:
 at least one lower channel layer disposed on the active region, the at least one lower channel layer including silicon, and
 an uppermost channel layer disposed on the at least one lower channel layer and spaced apart from the at least one lower channel layer in a vertical direction perpendicular to the upper surface of the substrate, wherein the uppermost channel layer has a thickness greater than a thickness of the at least one lower channel layer, includes a material that is different from a material included in the at least one lower channel layer, and includes silicon carbide;
a gate structure disposed on the substrate, intersecting the active region and the plurality of channel layers, and extending in a second horizontal direction, wherein the gate structure includes a gate electrode surrounding the plurality of channel layers;
spacer structures disposed on opposing sidewalls of the gate structure; and
a source/drain region disposed on the active region on at least one side of the gate structure and contacting the plurality of channel layers.

20. The semiconductor device of claim 19, wherein:
the uppermost channel layer includes:
 a central region vertically overlapping the gate structure, and
 peripheral regions disposed on opposing sides of the central region; and
a first thickness of the uppermost channel layer in the central region is greater than a second thickness of the uppermost channel layer in the peripheral regions.

* * * * *